United States Patent
Bruhn, Jr. et al.

(10) Patent No.: US 10,845,425 B2
(45) Date of Patent: Nov. 24, 2020

(54) SYSTEMS AND METHODS FOR DETECTING SWITCHING CIRCUITRY FAILURE

(71) Applicant: Control4 Corporation, Salt Lake City, UT (US)

(72) Inventors: Robert Don Bruhn, Jr., West Jordan, UT (US); Timothy Paul Spens, Saratoga Springs, UT (US); Jon A. Nelson, Bluffdale, UT (US)

(73) Assignee: WirePath Home Systems, LLC, Salt Lake City, UT (US)

( * ) Notice: Subject to any disclaimer, the term of this patent is extended or adjusted under 35 U.S.C. 154(b) by 424 days.

(21) Appl. No.: 15/419,806

(22) Filed: Jan. 30, 2017

(65) Prior Publication Data

US 2018/0217205 A1 Aug. 2, 2018

(51) Int. Cl.
*G01R 31/42* (2006.01)

(52) U.S. Cl.
CPC .................. *G01R 31/42* (2013.01)

(58) Field of Classification Search
CPC ............ G01R 31/2621; G01R 31/2637; G01R 31/2639; G01R 31/275; G01R 31/327; G01R 31/3275; G01R 31/3277; G01R 31/42; G01R 31/44; G01R 11/50; G01R 11/52; G01R 11/54; G01R 19/00; G01R 19/02; G01R 19/04; G01R 19/06; G01R 19/145; G01R 19/15; G01R 19/155; G01R 19/165; G01R 19/16571; G01R 19/16576; G01R 19/1659; G01R 19/175; G01R 31/02; G01R 31/024; G01R 31/026; G01R 31/027; H03K 17/18; H01H 47/002; H05B 33/0815; H05B 33/0884; H05B 33/0887; H05B 33/089; H05B 37/02; H05B 41/2828; H05B 33/0821; H05B 33/0824; H05B 33/0845; H05B 33/0848; H05B 33/0851; H05B 33/0854; H05B 39/048; H05B 41/3927; Y02B 20/146; Y02B 20/148; Y02B 20/346; H02H 3/382
USPC .................... 315/127, 186, 194, 209 R, 291; 323/265–284, 905; 324/762.01, 762.09, 324/76.77, 713; 361/18; 327/74–79
See application file for complete search history.

(56) References Cited

U.S. PATENT DOCUMENTS

| | | | | |
|---|---|---|---|---|
| 8,441,210 B2* | 5/2013 | Shteynberg | ............ | H05B 45/10 315/308 |
| 8,891,218 B2* | 11/2014 | Holley | .................. | H03K 17/18 361/86 |
| 8,988,050 B2* | 3/2015 | Newman, Jr. | ........... | H02M 7/06 323/239 |
| 9,279,835 B2 | 3/2016 | Russell et al. | | |
| 2006/0255746 A1* | 11/2006 | Kumar | ................. | H05B 39/044 315/209 R |

(Continued)

*Primary Examiner* — Steven L Yeninas
(74) *Attorney, Agent, or Firm* — Austin Rapp

(57) ABSTRACT

An electronic device for detecting switching circuitry failure is described. The electronic device includes load voltage measuring circuitry configured to measure a load voltage to produce a load voltage measurement. The electronic device also includes a processor coupled to the load voltage measuring circuitry. The processor is configured to detect switching circuitry failure based on the load voltage measurement. The processor is configured to control the switching circuitry based on whether switching circuitry failure is detected.

20 Claims, 19 Drawing Sheets

(56) References Cited

U.S. PATENT DOCUMENTS

| | | | |
|---|---|---|---|
| 2008/0151451 A1* | 6/2008 | Kilroy | H02M 5/293 |
| | | | 361/86 |
| 2009/0219049 A1* | 9/2009 | Meagher | G01R 31/024 |
| | | | 324/762.09 |
| 2010/0060204 A1* | 3/2010 | Ohtake | H05B 33/0815 |
| | | | 315/307 |
| 2011/0058296 A1* | 3/2011 | Orchowski | H05B 39/044 |
| | | | 361/88 |
| 2012/0049749 A1* | 3/2012 | Pearlman | H05B 37/0245 |
| | | | 315/161 |
| 2013/0200707 A1* | 8/2013 | Hartmann | H02J 9/02 |
| | | | 307/39 |
| 2016/0238652 A1* | 8/2016 | Engelhardt | G01R 31/024 |
| 2018/0024196 A1* | 1/2018 | Imura | H02H 1/0007 |
| | | | 324/762.01 |
| 2018/0092174 A1* | 3/2018 | Mosebrook | H05B 33/0815 |
| 2018/0231591 A1* | 8/2018 | Chen | G01R 19/175 |

* cited by examiner

SYSTEMS AND METHODS FOR DETECTING SWITCHING CIRCUITRY FAILURE

TECHNICAL FIELD

The present disclosure relates generally to electronic devices. More specifically, the present disclosure relates to systems and methods for detecting switching circuitry failure.

BACKGROUND

In recent years, the price of electronic devices has decreased dramatically. In addition, the size of electronic devices has continued to decrease. Further, electronic devices continue to increase in capability and convenience.

Decreasing prices and increasing capabilities of electronic devices has permitted modern devices to be conveniently used in homes and businesses. Many homes and businesses include multiple electronic devices to assist in everyday tasks. For example, electronic devices may be used for convenience and/or entertainment.

While some electronic devices may provide convenience and entertainment, many also require control. Moreover, these electronic devices consume electrical power. Safety is also a concern with some electronic devices. As can be observed from this discussion, improvements to electronic device ease of use and/or safety may be beneficial.

DETAILED DESCRIPTION

Figure 1:
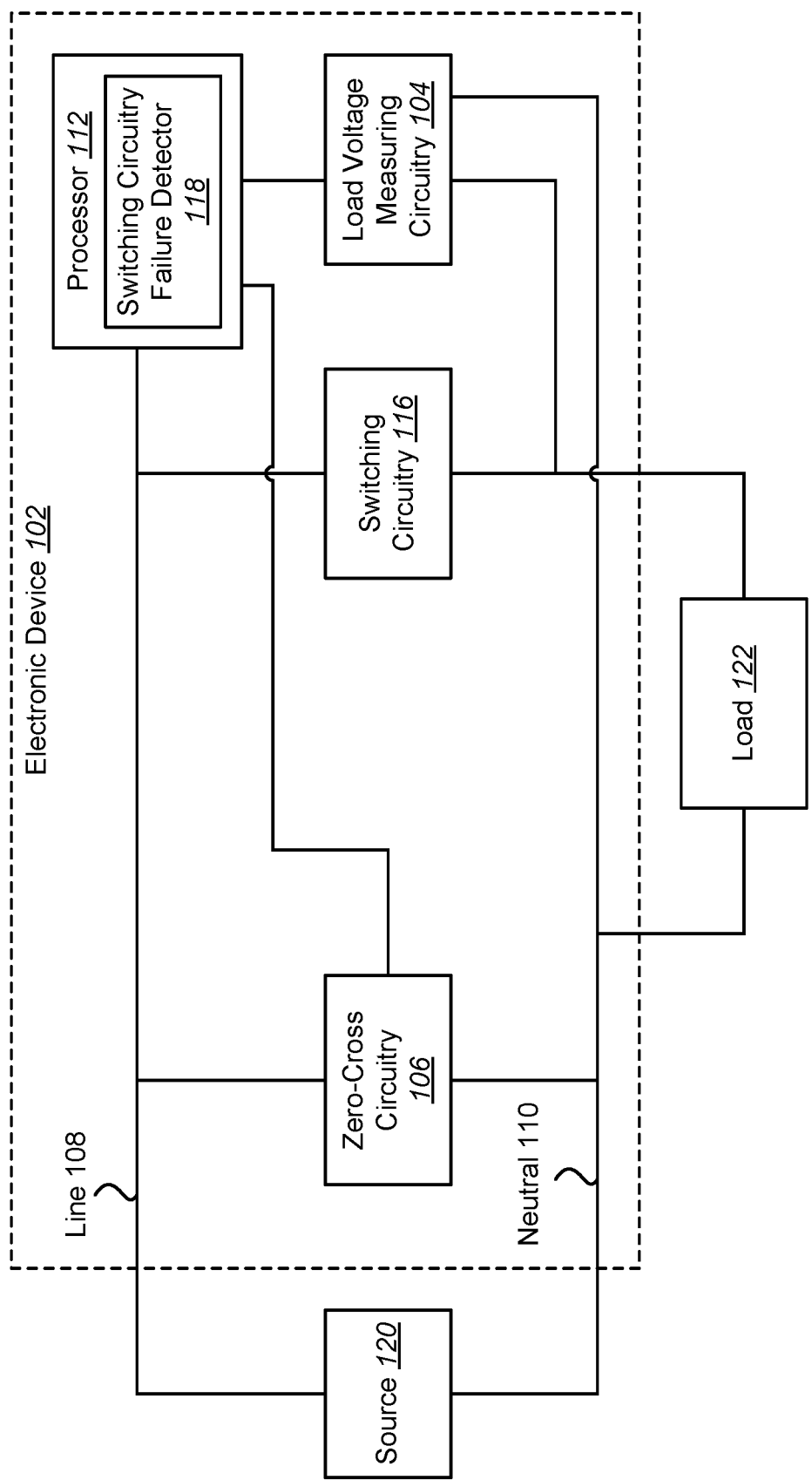
FIG. 1 is a block diagram illustrating one configuration of an electronic device for detecting switching circuitry failure.

An electronic device for detecting switching circuitry failure is described. The electronic device includes load voltage measuring circuitry configured to measure a load voltage to produce a load voltage measurement. The electronic device also includes a processor coupled to the load voltage measuring circuitry. The processor is configured to detect switching circuitry failure based on the load voltage measurement. The processor is also configured to control the switching circuitry based on whether switching circuitry failure is detected.

In a case that switching circuitry failure is detected, the processor may be configured to control the switching circuitry by setting the switching circuitry to a fully activated state. Setting the switching circuitry to a fully activated state may include setting a dimming level to no dimming.

The processor may be configured to detect switching circuitry failure by detecting asymmetry in the load voltage measurement. The processor may be configured to detect the asymmetry in the load voltage measurement by detecting voltage of only one polarity in the load voltage measurement. The processor may be configured to detect the asymmetry in the load voltage measurement by detecting no zero cross within a time period. The processor may be configured to detect the asymmetry in the load voltage measurement by detecting a difference between a swing measure for an upswing and a swing measure for a downswing.

The processor may be configured to detect switching circuitry failure by detecting asymmetry in the load voltage measurement with a threshold current draw. The electronic device may include current measuring circuitry configured to produce a current measurement. The processor may be configured to detect the threshold current draw based on the current measurement. The processor may be configured to indicate a fault in a case that switching circuitry failure is detected.

A method for detecting switching circuitry failure by an electronic device is also described. The method includes measuring a load voltage to produce a load voltage measurement. The method also includes detecting switching circuitry failure based on the load voltage measurement. The method further includes controlling the switching circuitry based on whether switching circuitry failure is detected.

A non-transitory computer-readable medium for detecting switching circuitry failure is also described. The computer-readable medium includes executable instructions for detecting switching circuitry failure based on a load voltage measurement. The computer-readable medium also includes executable instructions for controlling the switching circuitry based on whether switching circuitry failure is detected.

Some configurations of the systems and methods disclosed herein may relate to detecting switching circuitry failure. For example, some configurations of the systems and methods disclosed herein may provide approaches for detecting a metal-oxide-semiconductor field-effect transistor (MOSFET) failure using load voltage measurement circuitry. In some approaches, the electronic device (e.g., dimmer) and/or the load may be protected by driving the load in a fully activated (e.g., "full-on") state.

When a MOSFET fails on a MOSFET-based phase-cut dimmer, the load may be driven with a half-wave asymmetrical waveform. This may essentially create a 50% duty cycle direct current (DC) voltage on the load. This behavior may be dangerous when combined with inductive or magnetic loads commonly referred to as magnetic low voltage (MLV) loads. The asymmetry of the blown MOSFET AC waveform driving the inductive load may drive the load into saturation, which may cause the load to excessively heat and may lead to catastrophic failure.

Using load voltage measuring circuitry and/or current measuring circuitry, a processor (e.g., central processing unit (CPU)) may implement an algorithm to determine if switching circuitry (e.g., a MOSFET) has failed. This algorithm may work when the electronic device (e.g., a dimmer) is in an off or an on state. For example, the algorithm may work in both states. If the electronic device (e.g., dimmer) has failed switching circuitry (e.g., a failed MOSFET), the algorithm may detect the failed switching circuitry and turn the dimmer fully on. This may protect the electronic device (e.g., dimmer) from more damage and/or may prevent damage to an attached load (e.g., inductive or magnetic load). In some configurations, the electronic device (e.g., dimmer) may show a fault state with an indicator light (e.g., light emitting diodes (LEDs)) and/or may report the failure (e.g., MOSFET fault) to a control system.

Asymmetry may be measured and/or determined by a processor (e.g., an algorithm on a CPU) using load voltage measurement circuitry and/or current measurement circuitry. For example, the algorithm may determine if a MOSFET is blown when a dimmer is in the on state or off state. In some approaches, a threshold current draw (e.g., a minimum current draw) may be utilized to prevent false failure detections, while still detecting an inductive load (e.g., even small inductive loads) being driven with an asymmetrical waveform. When asymmetry is detected, the electronic device (e.g., dimmer) may turn fully on, which may remove the asymmetry and may protect the dimmer and load from damage. The electronic device (e.g., dimmer) may show a fault state (to a user, for example), where one or more lights (e.g., LEDs) on the electronic device may show that a fault has occurred. Additionally or alternatively, the electronic device (e.g., dimmer) may reports the switching circuitry failure (e.g., failed MOSFET) to another device (e.g., control system, home automation system, etc.).

Some of the configurations described herein may provide one or more benefits. For example, switching circuitry failure detection (e.g., failed MOSFET detection) may be utilized to protect an electronic device (e.g., dimmer) from further damage and/or may prevent damage to one or more attached loads (e.g., inductive loads). Some configurations of the systems and methods disclosed herein may reduce circuitry (e.g., device size and/or cost). For example, some configurations may avoid the need for additional protection circuitry for opening the high voltage path in case of a switching circuitry (e.g., MOSFET) failure. For instance, some configurations may eliminate the need for a relay to open the circuit to protect the electronic device and/or load in case of failed switching circuitry (e.g., MOSFET failure).

As used herein, the term "couple" and other variations thereof (e.g., "coupled," "coupling," etc.) may mean that one element is connected to another element directly or indirectly. For example, if a first element is coupled to a second element, the first element may be connected directly to the second element (without any intervening element, for example) or may be connected to the second element through one or more other elements. Lines in one or more of the Figures (e.g., in the block diagrams) may indicate couplings.

Various configurations are now described with reference to the figures, where like reference numbers may indicate functionally similar elements. The systems and methods as generally described and illustrated in the figures herein could be arranged and designed in a wide variety of different configurations. Thus, the following more detailed description of several configurations, as represented in the Figures, is not intended to limit scope, as claimed, but is merely representative of the systems and methods. As used herein, the term "plurality" may indicate two or more. For example, a plurality of components may refer to two or more components.

FIG. 1 is a block diagram illustrating one configuration of an electronic device 102 for detecting switching circuitry failure. The electronic device 102 may include load voltage measuring circuitry 104, a processor 112, switching circuitry 116, and/or zero-cross circuitry 106. The processor 112 may be coupled to the load voltage measuring circuitry 104, to the switching circuitry 116 and/or to the zero-cross circuitry 106.

Examples of electronic devices 102 include electronic circuits, integrated circuits, circuits with discrete components (e.g., resistors, capacitors, transistors, metal-oxide-semiconductor field-effect transistors (MOSFETs), etc.), computers, and/or devices that include one or more processors, memory cells, latches, logic gates, etc. For instance, the electronic device 102 may be a switch and/or dimmer that includes discrete components and a processor 112 (e.g., microprocessor) that may be used to detect switching circuitry failure. The processor 112 may include and/or access software in memory and/or firmware. For example, the electronic device 102 may include memory. The memory may be included on-board the processor 112 or may be separate from the processor 112. The memory may store instructions and/or data (e.g., samples, voltage samples, and/or current samples, etc.). Additionally or alternatively, the memory or a separate memory may store firmware. In some configurations, the electronic device 102 may be a MOSFET-based dimmer (e.g., not a TRIAC-based dimmer). For example, the electronic device 102 may not include any TRIACs in some implementations. Additionally or alternatively, the electronic device 102 may be a phase-cut dimmer in some implementations. In some configurations, the electronic device 102 may be housed within a wall box.

The electronic device 102 may be coupled to a source 120 (e.g., an alternating current (AC) voltage source) and/or to a load 122. For example, the electronic device 102 may be coupled to the source 120 on a line 108 coupling (e.g., line 108 terminal) and a neutral 110 coupling (e.g., neutral 110 terminal). For example, an AC voltage may be provided to the electronic device 102 through the feed line 108. In some configurations, the source 120 may output an AC voltage (e.g., 240 volts (V), 120 V, etc.). The AC voltage may be provided to the electronic device 102 between the line 108 (e.g., "hot") and neutral 110. The voltage between the line 108 and neutral 110 may be referred to as line voltage.

The electronic device 102 may be coupled to a load 122. For example, the switching circuitry 116 of the electronic device 102 may be coupled to the load 122. The load 122 may also be coupled to the electronic device 102 at neutral 110 (e.g., a neutral line). The switching circuitry 116 may activate or deactivate the load 122. For example, the switching circuitry 116 state may determine whether the load 122 is activated (e.g., whether voltage is supplied to the load 122, whether the load 122 is "turned on," etc.). In some implementations, the switching circuitry 116 may include two switches (e.g., MOSFETs, MOSFETs with coupled drains, etc.).

Some load types may include inductive, capacitive, and resistive load types. Inductive load types may have a magnetic inductor of some sort. One example of an inductive load is a magnetic transformer for low voltage (e.g., magnetic low voltage (MLV)) lighting. Inductive load types may have a waveform characteristic in which the phase of the current lags (e.g., comes after) the voltage waveform. However, some inductive loads may have very little current lag. For example, some toroidal MLV loads may have power factors that are very close to 1 (where resistive loads may have a power factor of 1).

Capacitive load types may have a detectable amount of capacitance. Examples of capacitive loads are dimmable fluorescent lights and electronic low voltage (ELV) lighting. Capacitive load types may have a waveform characteristic in which the phase of the current leads (e.g., comes before) the voltage waveform. However, some capacitive loads may exhibit a different waveform characteristic due to a power supply. For example, some capacitive loads may have a waveform characteristic in which the phase of the current lags a voltage waveform (e.g., line voltage waveform) due to an activation delay resulting from a power supply.

Resistive load types may exhibit current and voltage waveforms in phase with each other. For example, there may be no significant (e.g., discernible) lead or lag between current and voltage in resistive load types. Examples of resistive loads include incandescent and halogen lights.

In some configurations, the electronic device 102 may be a dimmer and/or may include a dimmer. For example, the switching circuitry 116 may activate and/or deactivate the load 122 (periodically and/or cyclically, for instance) in order to achieve a particular dimming level. This may be referred to as "phase-cut" dimming, where different amounts (e.g., time segments, portions, etc.) of load voltage may be cut (e.g., deactivated) in order to produce different dimming levels. When no portion of the load voltage is cut, the load 122 may be driven in a fully activated state, where the full cycle of load voltage is provided. This may be referred to as a "full-on" (e.g., 100%) dimming level (e.g., a dimming level of no dimming). A range of cycle portions may be cut according to dimming level. For example, a half (e.g., 50%) dimming level may cut approximately half of the load voltage cycle. Other dimming levels (e.g., 0%, 25%, 33%, 75%, 90%, etc.) may similarly be achieved by controlling the switching circuitry 116 to cut corresponding portions from the load voltage cycle.

As described above, switching circuitry 116 may fail in some cases. For example, the switching circuitry 116 (e.g., one or more transistors, MOSFETs, etc.) may fail due to age, usage, and/or damage. For instance, a failed MOSFET (e.g., blown MOSFET) may bridge current without the ability to switch off. In some configurations, the switching circuitry 116 may include two switches. One switch (e.g., a first switch, MOSFET, etc.) may be utilized to switch on all or portions of upswing voltage (e.g., an upward swing of AC voltage, a positive swing of AC voltage, etc.). Another switch (e.g., a second switch, MOSFET, etc.) may be utilized to switch on all or portions of downswing voltage (e.g., a downward swing of AC voltage, a negative swing of AC voltage, etc.). In some cases, one of the switches may fail, causing the switch to provide all of the voltage with the corresponding polarity. This may produce an asymmetrical waveform (in a polarity aspect, for example), because the non-failed or operable switch may still switch off a portion of the other polarity. For example, in a case where a first switch has failed (corresponding to a positive polarity) and a second switch is turned off, only upswings in the AC voltage may be provided. As described above, this behavior may damage the electronic device 102 and/or the load 122 and/or may potentially cause a catastrophic failure of the load 122. Some configurations of the systems and methods disclosed herein may be utilized to ameliorate one or more of these issues.

A load voltage may be a voltage between electronic device 102 lines for a load (e.g., between load couplings, between load terminals, between the switching circuitry 116 and neutral 110, etc.). The load voltage measuring circuitry 104 is configured to measure the load voltage to produce a load voltage measurement (e.g., a voltage waveform). For example, the load voltage measuring circuitry 104 may continuously capture the load voltage measurement (e.g., voltage waveform) by sampling the load voltage for one or more cycles of AC voltage (across the load 122, for instance). The measured load voltage and/or load voltage measurement may be provided to the processor 112. The load voltage measuring circuitry 104 may include discrete components (e.g., one or more resistors, capacitors, transistors, amplifiers, chip packages, etc.). In some configurations, the load voltage measuring circuitry 104 may only include discrete components.

In some configurations, the load voltage measuring circuitry 104 may capture a continuous time (e.g., analog) voltage waveform. The continuous time voltage waveform may represent how the load voltage varies over each cycle. In some configurations, the electronic device 102 may include and/or utilize an analog-to-digital converter (ADC) for capturing a discrete time (e.g., digital) voltage waveform of the load voltage by sampling the continuous time voltage waveform. For example, the ADC may sample at sufficient intervals to capture how the load voltage varies over one or more cycles. An example of a voltage waveform is described in more detail below in relation to FIG. 12. A digital voltage waveform may be one example of the load voltage measurement.

It should be noted that a load voltage measurement may be distinct from a line voltage measurement. For example, a load voltage measurement may indicate a load voltage across a load 122, while a line voltage measurement may indicate a line voltage across a source 120. In some configurations, the load voltage may be on a different side of the switching circuitry 116 than the line voltage. For example, the line voltage may be taken from the line 108 feed of the electronic device 102 (e.g., on the "front" side of the switching circuitry 116), while the load voltage may be taken from across the load 122 (e.g., on the "back" side of the switching circuitry 116). In some implementations of the systems and methods disclosed herein, no line voltage measurement (e.g., line voltage waveform) may be taken.

In some configurations, the electronic device 102 (e.g., load voltage measuring circuitry 104 and/or the processor 112) may determine one or more load voltage zero crossings. For example, the load voltage measuring circuitry 104 and/or the processor 112 may determine one or more times when the load voltage (e.g., load voltage measurement) crosses zero voltage. In some approaches, the load voltage measuring circuitry 104 and/or the processor 112 may determine the time when the load voltage is zero following a time when the load voltage is non-zero for a measurable duration. Additionally or alternatively, the load voltage measuring circuitry 104 and/or the processor 112 may determine a time when the load voltage crosses from a positive value to a negative value or crosses from a negative value to a positive value. Examples of voltage zero crossings are given in relation to FIG. 16.

In some implementations, the load voltage measuring circuitry 104 may determine and/or indicate one or more load voltage zero crossings to the processor 112. For example, the load voltage measuring circuitry 104 may send a signal (e.g., a step signal, a bit, a code, etc.) to the processor 112 that indicates the timing for the one or more load voltage zero crossings. Additionally or alternatively, the processor 112 may utilize the load voltage measurement (e.g., voltage waveform) to determine one or more load voltage zero crossings. One or more load voltage samples and/or load voltage zero crossings (e.g., load voltage zero cross timings, time stamps, etc.) may be stored in memory in some implementations.

The (optional) zero-cross circuitry 106 may detect a line voltage zero cross (e.g., one or more zero cross times for the line voltage). For example, the zero-cross circuitry 106 may determine the time (e.g., position) where the line voltage crosses a zero point. In other words, the zero-cross circuitry 106 may determine the time when the value of the line voltage is zero. The time when the value of the line voltage is zero may be the line voltage zero cross. In some approaches, the zero-cross circuitry 106 may detect at time at which the line voltage switches from negative to positive or positive to negative. For example, the line voltage zero cross may be determined (e.g., estimated) as a time between positive and negative voltage samples (e.g., between a last positive voltage sample and a first negative voltage sample in a cycle or between a last negative voltage sample and a first positive voltage sample). One or more line voltage zero crossings (e.g., line voltage zero cross timings, time stamps, etc.) may be stored in memory in some implementations.

The processor 112 may direct the operation of the electronic device 102. In some configurations, the processor 112 may include a processor and instructions in memory (e.g., software, firmware, or both) for controlling the electronic device 102. In some configurations, the processor 112 may include and/or implement a switching circuitry failure detector 118. The processor 112 (e.g., switching circuitry failure detector 118) may detect whether the switching circuitry 116 has failed (e.g., if one or more switches of the switching circuitry 116 are not operating correctly).

In some configurations, the switching circuitry failure detector 118 may detect switching circuitry failure based on the load voltage measurement. For example, the switching circuitry failure detector 118 may detect switching circuitry failure by detecting asymmetry in the load voltage measurement. Asymmetry may indicate switching circuitry failure. For example, the switching circuitry failure detector 118 may detect switching circuitry failure if asymmetry in the load voltage measurement (e.g., waveform) is detected.

In some approaches, the switching circuitry failure detector 118 may detect asymmetry in the load voltage measurement by detecting voltage of only one polarity (e.g., positive or negative) in the load voltage measurement. For example, if the load voltage measurement indicates that the only (non-zero) values are only positive values or only negative values in a time period (e.g., over one or more AC cycles), the switching circuitry failure detector 118 may detect asymmetry in the load voltage measurement. In some approaches, only values that are beyond one or more thresholds may be considered for detecting asymmetry. For example, only values that are greater than a positive threshold or less than a negative threshold may be considered. This may help to filter out noisy values. In some configurations, the singular polarity technique may be utilized when the switching circuitry 116 is set to an "off" or deactivated state.

In some approaches, the switching circuitry failure detector 118 may detect asymmetry in the load voltage measurement by detecting a lack of one or more zero crossings from the load voltage measurement. For example, if the load voltage measurement does not indicate a zero cross within a time period (e.g., one or more AC cycles), the switching circuitry failure detector 118 may detect asymmetry in the load voltage measurement. In some configurations, the lack of zero crossings technique may be utilized when the switching circuitry 116 is set to an "off" or deactivated state.

In some approaches, the switching circuitry failure detector 118 may detect asymmetry in the load voltage measurement by detecting a difference in at least one swing measure for an upswing (e.g., positive swing) and a downswing (e.g., negative swing) in the load voltage measurement. Examples of swing measures include swing widths (e.g., amount of non-zero time per swing, swing widths beyond thresholds), swing areas, swing areas beyond thresholds, average voltages, root mean square (RMS) voltages, etc. For example, the switching circuitry failure detector 118 may measure widths (e.g., times) of all or portions of the upswing and downswing in the load voltage measurement. For instance, the amounts of time between zero crossings for the upswing and for the downswing may be measured. Alternatively, an amount of time above a positive threshold for the upswing and an amount of time below a negative threshold for the downswing may be measured. The switching circuitry failure detector 118 may compare the upswing width and the downswing width. If the widths are different to a degree (e.g., if a width difference magnitude is greater than a threshold), the switching circuitry failure detector 118 may detect asymmetry in the load voltage measurement. In some configurations, the swing width technique may be utilized when the switching circuitry 116 is set to a partially dimmed state or a deactivated state.

In some approaches, the switching circuitry failure detector 118 may detect asymmetry in the load voltage measurement by detecting differences in one or more other swing measures (e.g., swing area, swing area above a threshold, average voltage, root mean square (RMS) voltage, etc.) of an upswing (e.g., positive swing) and a downswing (e.g., negative swing) in the load voltage measurement. For example, the switching circuitry failure detector 118 may determine a swing measure of all or portions of the upswing and downswing in the load voltage measurement. For instance, the swing measure may be determined for the upswing and for the downswing. The switching circuitry failure detector 118 may compare the upswing measure and the downswing measure. If the measures are different to a degree (e.g., if a swing measure difference magnitude is greater than a threshold), the switching circuitry failure detector 118 may detect asymmetry in the load voltage measurement. In some configurations, the swing measure technique may be utilized when the switching circuitry 116 is set to a partially dimmed state or a deactivated state.

In some approaches, the switching circuitry failure detector 118 may detect switching circuitry failure by detecting asymmetry in the load voltage measurement with a threshold current draw. For example, the electronic device 102 may include current measuring circuitry in some configurations. The current measuring circuitry may produce a current measurement, which may indicate a current flowing to or from the load 122. The switching circuitry failure detector 118 may detect switching circuitry failure if the load voltage measurement indicates an asymmetry and the current measurement indicates a threshold current draw. For example, if the current measurement meets one or more current thresholds when asymmetry is indicated by the load voltage measurement, the switching circuitry failure detector 118 may detect switching circuitry failure.

In some configurations, the current threshold (for threshold current draw, for example) may be based on a root mean square (RMS) current value taken over multiple cycles. For example, the current threshold may be set at 100 milliamperes (mA). It should be noted that the current threshold may vary and/or may be tailored for specific voltages (e.g., 120 V, 230 V, etc.). The current threshold value may additionally or alternatively change based on sample rates of the processor, measuring circuit, etc.

It should be noted that one or more current thresholds may be utilized. For example, a positive current threshold and a negative current threshold may be utilized. For instance, the switching circuitry failure detector 118 may determine whether the current measurement exceeds (e.g., is greater than) the positive current threshold or whether the current measurement exceeds (e.g., is less than or is greater in magnitude than) the negative current threshold. A threshold current draw may be indicated if the positive current threshold or the negative current threshold is exceeded. One or more current thresholds may be stored in memory in some implementations.

The processor 112 (e.g., switching circuitry failure detector 118) may control the switching circuitry 116 based on whether switching circuitry failure is indicated. For example, the switching circuitry failure detector 118 may set the switching circuitry to a fully activated state (e.g., full on, no phase cut, no dimming, 100%, etc.) in a case that switching circuitry failure is detected. Additionally or alternatively, the processor 112 (e.g., switching circuitry failure detector 118) may not allow the load 122 to be deactivated. For example, attempting to deactivate the load 122 while the switching circuitry 116 has failed may cause the load 122 to be driven with an asymmetric voltage waveform. As described above, this may cause damage to and/or catastrophic failure of the electronic device 102 and/or the load 122. Accordingly, setting the switching circuitry 116 to a fully activated state and/or not allowing load 122 deactivation may protect the electronic device 102 and/or the load 122. In some situations, this may cause the load 122 to be driven until a breaker is shut off (e.g., manually shut off) and/or until the electronic device 102 is decoupled from the source 120. In other configurations, the processor 112 (e.g., switching circuitry failure detector 118) may control a relay to cause an open circuit (e.g., to cut electrical power from the source 120).

If switching circuitry failure is detected, the processor 112 (e.g., switching circuitry failure detector 118) may indicate a fault in some configurations. For example, the electronic device 102 may activate a light indicating the fault, may turn a status light to a particular color (e.g., red), and/or may send a fault message to another device (e.g., to a control system, home automation system, etc.). If switching circuitry failure is not detected, the switching circuitry failure detector 118 may not take any action (e.g., may allow the switching circuitry 116 to continue operating normally).

In some implementations, switching circuitry failure detection may be performed during and/or after an initialization (e.g., "boot-up," etc.) of the electronic device 102. For example, the electronic device 102 may perform one or more initialization procedures when the source 120 first supplies power to the electronic device 102 (e.g., when the electronic device 102 is initially coupled to the source 120, when the source 120 is initially supplied (or re-supplied), etc.). For instance, the electronic device 102 may perform one or more initialization procedures when a breaker switch is closed to supply power to the electronic device 102. Additionally or alternatively, the electronic device 102 may perform one or more initialization procedures upon restoration of power (e.g., when power is restored after a power outage, etc.). In some implementations, the initialization procedures may include detecting switching circuitry failure. Switching circuitry failure detection may additionally or alternatively be performed after the initialization phase (in an operation phase, a steady-state phase, etc., for example).

The electronic device 102 (e.g., processor 112 and/or switching circuitry 116) may control the amount of power delivered to the load 122. In some configurations (e.g., switch, dimmer, etc.), the switching circuitry 116 may turn on (e.g., activate) the power or turn off (e.g., deactivate) the power to the load 122. Additionally or alternatively, the electronic device 102 (e.g., processor 112 and/or switching circuitry 116) may adjust the amount of power that is delivered to the load 122 (e.g., enable, disable, adjust duty cycle, cut phase, increase phase, etc.). Examples of the switching circuitry 116 may include one or more switches (e.g., mechanical relay, solid state relay, MOSFETs, transistors, etc.). The switching circuitry 116 may include discrete components. In some configurations, the switching circuitry 116 may only include discrete components.

In some configurations, the electronic device 102 may be housed in a wall box. For example, the electronic device 102 may be configured to be contained within a wall box as an electrical device. A wall box (e.g., electrical box, outlet box, switch box, pattress, etc.) is the container for the body of an electrical device (e.g., light switch, power outlet, dimmer, etc.). While housed in the wall box, the face of the electrical device may be approximately flush with a wall. In general, the width of a wall box may be measured in "gangs," which indicates the number of electrical devices (e.g., light switches, power outlets, dimmers, etc.) that the wall box can hold. For example, a single-gang wall box may hold a single electrical device and a double-gang wall box may hold two electrical devices (side by side, for example). The depth of a wall box may be standard depth, shallow depth, or deep depth. In some configurations of the systems and methods disclosed herein, a wall box may be a single-gang standard depth wall box and a wall box device may be an electronic device 102 that may be held in a single-gang standard depth wall box. In one configuration, a European style wall box having a width of 86 millimeters, a height of 86 millimeters and a depth of 35 millimeters may be used. In another configuration, a United States style, single-gang, standard depth wall box may be used. It should be noted that other configurations of the systems and methods disclosed herein may not be housed in a wall box. For example, some configurations of the systems and methods disclosed herein may be implemented in lighting devices that are not housed in wall boxes. Additionally or alternatively, a spacer may be utilized in some configurations that places a portion of the device (e.g., an electronic device 102) outside of a wall box.

A wall box dimmer is another example of an electronic device 102 with variable states that may be used to control a load 122. A wall box dimmer may variably adjust the amount of electrical power that is driven to the load 122 (e.g., by adjusting the root mean square (RMS) voltage, adjusting pulse-width modulation, adjusting duty cycle, adjusting a phase cut, etc.). For example, a wall box dimmer may provide 0% electrical power, 100% electrical power or some percentage in between. In one configuration, a wall box dimmer may use one or more semiconductors (e.g., MOSFETs, transistors, etc.) to control the load. A simple example of a wall box dimmer is a light dimmer that may turn on or off and variably control the brightness of a light. For example, the light dimmer may increase the brightness of the light by increasing the amount of electrical power driven to the light. Similarly, the light dimmer may decrease the brightness of the light by decreasing the amount of electrical power driven to the light. In some configurations, the wall box device may include switching and dimming capabilities.

It should be noted that one or more of the elements or components described in relation to FIG. 1 may be combined and/or divided in some configurations. For example, the zero-cross circuitry 106, switching circuitry 116, processor 112, and/or load voltage measuring circuitry 104 may be divided into smaller elements or components that perform a subset of the functions described herein. Additionally or alternatively, one or more of the zero-cross circuitry 106, switching circuitry 116, processor 112, and/or load voltage measuring circuitry 104 may be combined.

Figure 2:
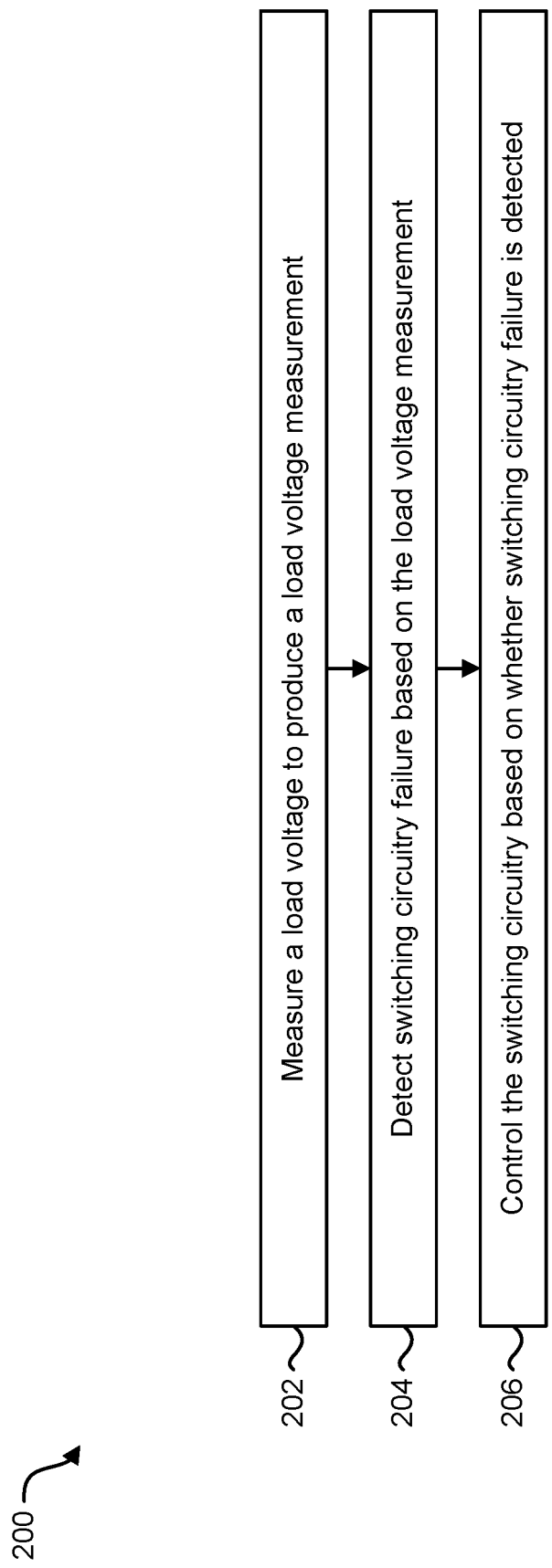
FIG. 2 is a flow diagram illustrating one configuration of a method for detecting switching circuitry failure.

FIG. 2 is a flow diagram illustrating one configuration of a method 200 for detecting switching circuitry failure. The method 200 may be performed by the electronic device 102 described in relation to FIG. 1. The electronic device 102 may measure 202 a load voltage to produce a load voltage measurement. This may be accomplished as described in relation to FIG. 1. For example, the electronic device 102 (e.g., load voltage measuring circuitry 104) may measure 202 the load voltage as a load voltage measurement (e.g., a voltage waveform, a series of voltage data samples, etc.). The load voltage measurement may indicate the load voltage (e.g., voltage across a load 122) for one or more cycles (e.g., AC voltage cycles).

The electronic device 102 may detect 204 switching circuitry failure based on the load voltage measurement. This may be accomplished as described in relation to FIG. 1. For example, the electronic device 102 (e.g., processor 112) may detect asymmetry in the load voltage measurement. Asymmetry may be detected based on singular polarity in a period of time, lack of zero crossings in a period of time, differing swing widths, and/or other differing swing measures. The electronic device 102 (e.g., processor 112) may detect 204 switching circuitry failure if asymmetry in the load voltage measurement is detected. In some approaches, the electronic device 102 may also detect a threshold current draw. For example, the electronic device 102 (e.g., processor 112) may detect 204 switching circuitry failure if asymmetry in the load voltage measurement is detected and a corresponding threshold current draw is detected.

The electronic device 102 may control 206 the switching circuitry based on whether switching circuitry failure is detected. This may be accomplished as described in relation to FIG. 1. For example, the electronic device 102 may set the switching circuitry to a fully activated state if switching circuitry failure is detected. In some approaches, the electronic device 102 may provide a fault indication if switching circuitry failure is detected. The electronic device 102 may allow the switching circuitry to continue operating normally if switching circuitry failure is not detected in some configurations.

Figure 3:
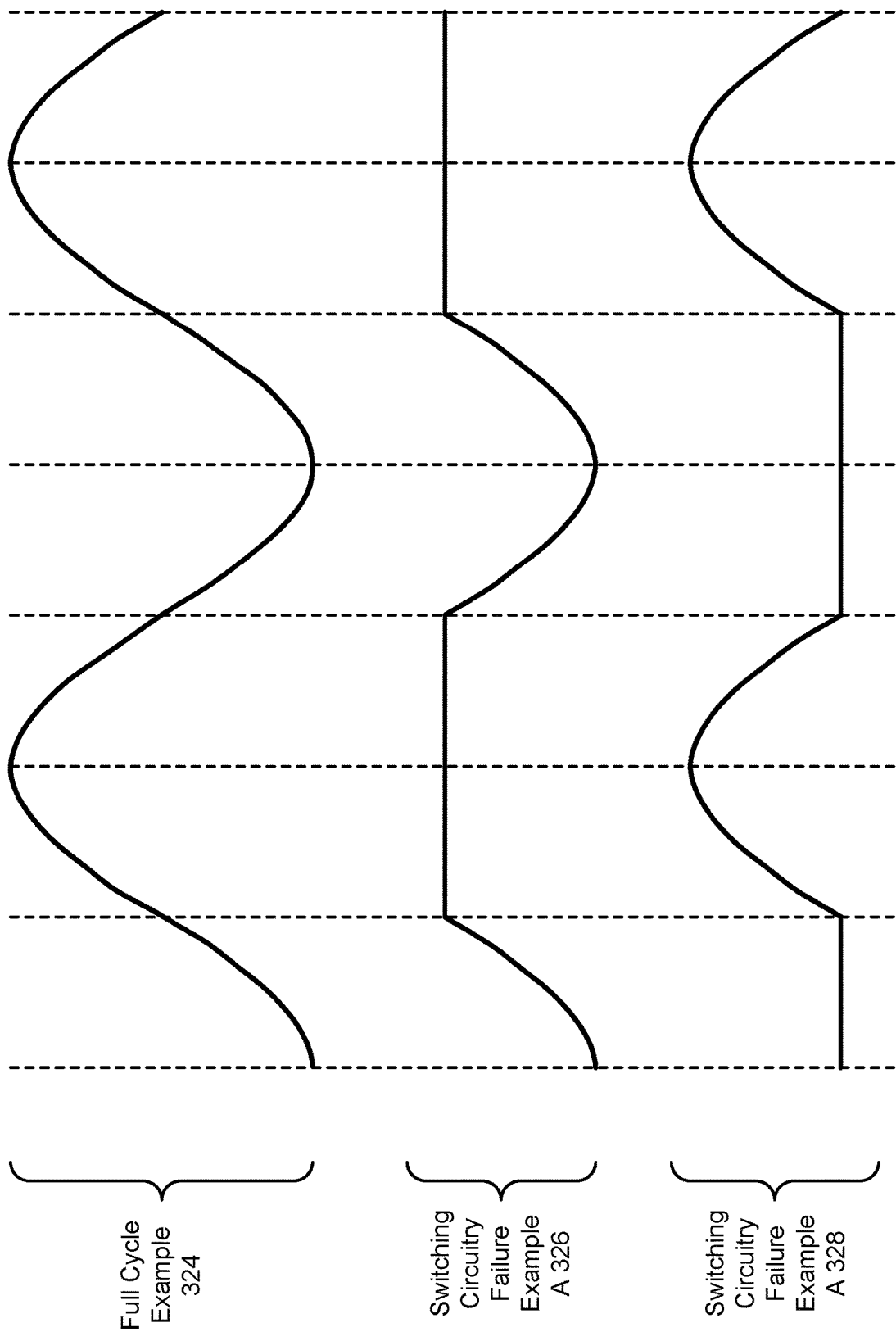
FIG. 3 is a diagram illustrating examples of voltage waveforms.

FIG. 3 is a diagram illustrating examples of voltage waveforms. In particular, FIG. 3 illustrates a full cycle example 324, switching circuitry failure example A 326, and switching circuitry failure example B 328. The full cycle example 324 illustrates an example of a load voltage waveform (e.g., load voltage measurement) where the entire waveform drives the load.

Switching circuitry failure example A 326 illustrates an example of a load voltage waveform (e.g., load voltage measurement) where one switch of the switching circuitry has failed. As illustrated in the switching circuitry failure example A 326, one of the switches (e.g., a switch for the downswing) cannot deactivate the downswing due to failure, while another switch (e.g., a switch for the upswing) is still functional and has deactivated the upswing. Accordingly, switching circuitry failure example A 326 illustrates an example of an asymmetrical load voltage measurement. In accordance with some configurations of the systems and methods disclosed herein, the electronic device 102 may detect the asymmetry in the load voltage waveform, which may indicate switching circuitry failure. For example, the asymmetrical waveform and switching circuitry failure may be detected due to only negative polarity voltage occurring in switching circuitry failure example A 326. For instance, the non-zero values of the load voltage measurement have only negative polarity as illustrated in switching circuitry failure example A 326. The electronic device 102 may utilize the asymmetry detection and/or switching circuitry failure detection to determine to set the switching circuitry to a fully activated state. Setting the switching circuitry to a fully activated state may cause the load to be driven as illustrated in the full cycle example 324, which may avoid asymmetry and/or prevent further damage and/or failure.

Switching circuitry failure example B 328 illustrates another example of a load voltage waveform (e.g., load voltage measurement) where another switch of the switching circuitry has failed. As illustrated in the switching circuitry failure example B 328, one of the switches (e.g., a switch for the upswing) cannot deactivate the upswing due to failure, while another switch (e.g., a switch for the downswing) is still functional and has deactivated the downswing. Accordingly, switching circuitry failure example B 328 illustrates an example of an asymmetrical load voltage measurement. In accordance with some configurations of the systems and methods disclosed herein, the electronic device 102 may detect the asymmetry in the load voltage waveform, which may indicate switching circuitry failure. For example, the asymmetrical waveform and switching circuitry failure may be detected due to only positive polarity voltage occurring in switching circuitry failure example B 328. For instance, the non-zero values of the load voltage measurement have only positive polarity as illustrated in switching circuitry failure example B 328. The electronic device 102 may utilize the asymmetry detection and/or switching circuitry failure detection to determine to set the switching circuitry to a fully activated state. Setting the switching circuitry to a fully activated state may cause the load to be driven as illustrated in the full cycle example 324, which may avoid asymmetry and/or prevent further damage and/or failure.

Figure 4:
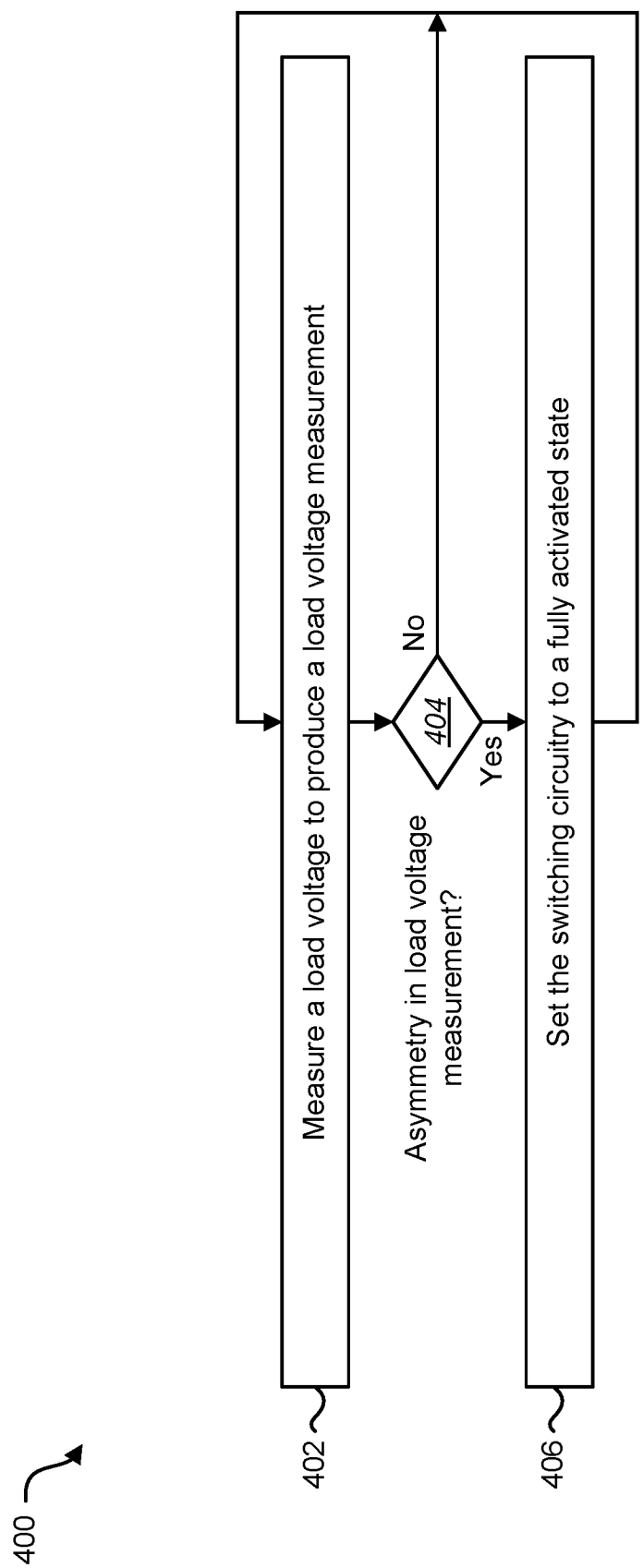
FIG. 4 is a flow diagram illustrating a more specific configuration of a method for detecting switching circuitry failure.

FIG. 4 is a flow diagram illustrating a more specific configuration of a method 400 for detecting switching circuitry failure. The method 400 may be performed by the electronic device 102 described in relation to FIG. 1. The electronic device 102 may measure 402 a load voltage to produce a load voltage measurement. This may be accomplished as described in relation to one or more of FIGS. 1-2.

The electronic device 102 may determine 404 whether asymmetry is indicated in the load voltage measurement. This may be accomplished as described in relation to one or more of FIGS. 1-3. For example, asymmetry may be detected based on singular polarity in a period of time, lack of zero crossings in a period of time, differing swing widths, and/or other differing swing measures. If asymmetry is not indicated and/or detected, the switching circuitry may continue to operate normally and load voltage measuring 402 may continue (for another time period, one or more swings, one or more switches, one or more cycles, etc., for example).

If asymmetry is indicated in the load voltage measurement, the electronic device 102 may set 406 the switching circuitry to a fully activated state. This may be accomplished as described in relation to one or more of FIGS. 1-3. For example, the electronic device 102 may set the switching circuitry to deliver one or more full AC voltage cycles to the load. In some approaches, the electronic device 102 may provide a fault indication if switching circuitry failure is detected.

Figure 5:
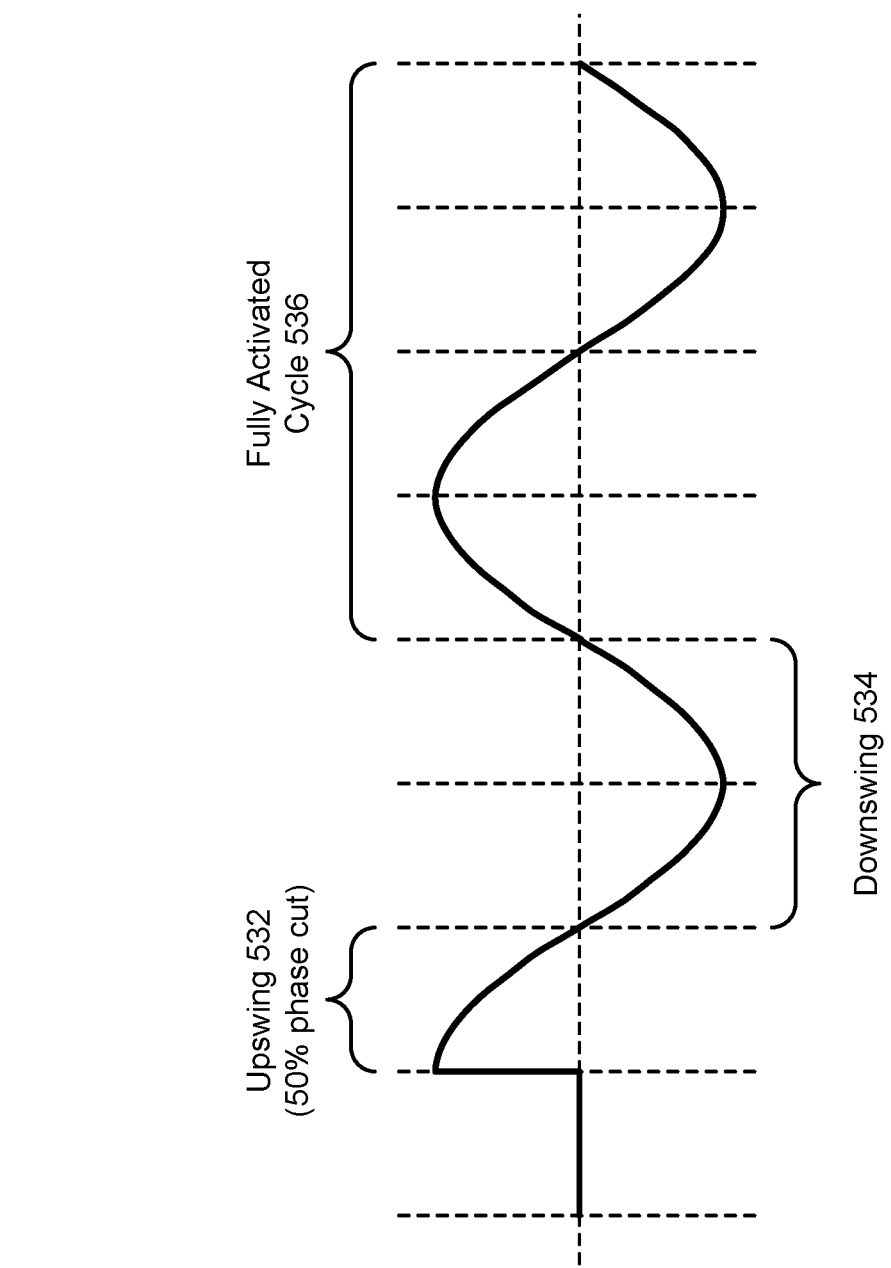
FIG. 5 is a diagram illustrating an example of load voltage over multiple cycles.

FIG. 5 is a diagram illustrating an example 530 of load voltage (e.g., load voltage measurement, a load voltage waveform, etc.) over multiple cycles. As illustrated in FIG. 5, an upswing 532 (e.g., positive swing) with a 50% phase cut (for 50% dimming, for example) occurs, followed by a full downswing 534 (e.g., negative swing). Accordingly, the example 530 illustrates an asymmetry in the load voltage measurement initially. In some approaches, the electronic device 102 may detect the asymmetry between the upswing 532 and the downswing 534 by comparing swing widths (e.g., times) or other swing measures. For example, the electronic device 102 may detect that the amount of time the upswing 532 is above zero voltage is about half of the amount of time the downswing 534 is below zero. Other swing measures (e.g., swing area, swing average, RMS values per swing, etc.) may be compared to detect the asymmetry in the load voltage measurement.

In response to detecting the asymmetry in the load voltage measurement, the electronic device 102 may set the switching circuitry to a fully activated state. As illustrated in the example 530, a fully activated cycle 536 may occur when the switching circuitry is set to the fully activated state. This may remove the asymmetry in the load voltage, which may avoid further damage and/or failure.

Figure 6:
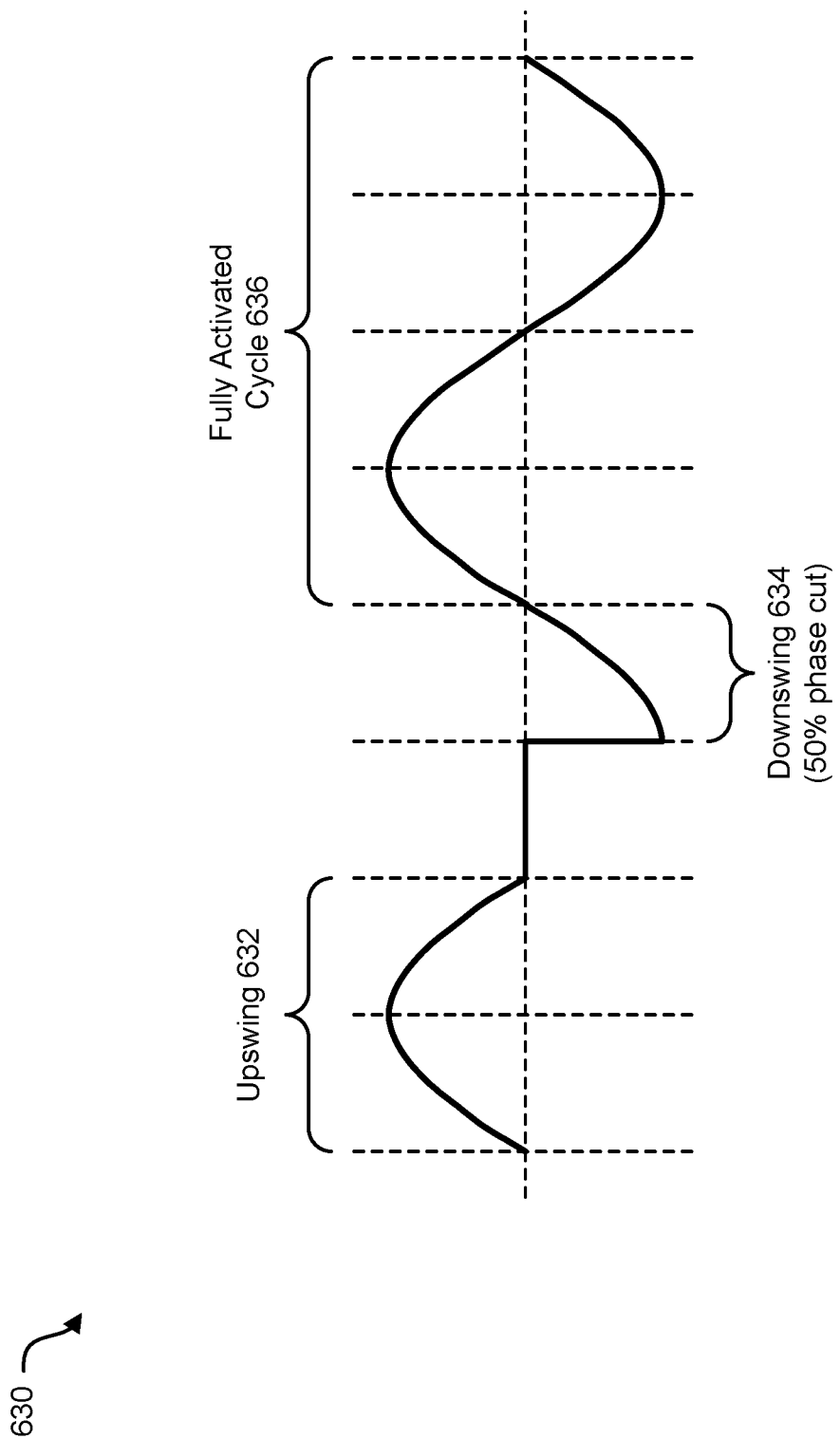
FIG. 6 is a diagram illustrating another example of load voltage over multiple cycles.

FIG. 6 is a diagram illustrating another example 630 of load voltage (e.g., load voltage measurement, a load voltage waveform, etc.) over multiple cycles. As illustrated in FIG. 6, a full upswing 632 (e.g., positive swing) occurs, followed by a downswing 634 (e.g., negative swing) with a 50% phase cut (for 50% dimming, for example). Accordingly, the example 630 illustrates an asymmetry in the load voltage measurement initially. In some approaches, the electronic device 102 may detect the asymmetry between the upswing 632 and the downswing 634 by comparing swing widths (e.g., times) or other swing measures. For example, the electronic device 102 may detect that the amount of time the upswing 632 is above zero voltage is about double the amount of time the downswing 634 is below zero. Other swing measures (e.g., swing area, swing average, RMS values per swing, etc.) may be compared to detect the asymmetry in the load voltage measurement.

In response to detecting the asymmetry in the load voltage measurement, the electronic device 102 may set the switching circuitry to a fully activated state. As illustrated in the example 630, a fully activated cycle 636 may occur when the switching circuitry is set to the fully activated state. This may remove the asymmetry in the load voltage, which may avoid further damage and/or failure.

Figure 7:
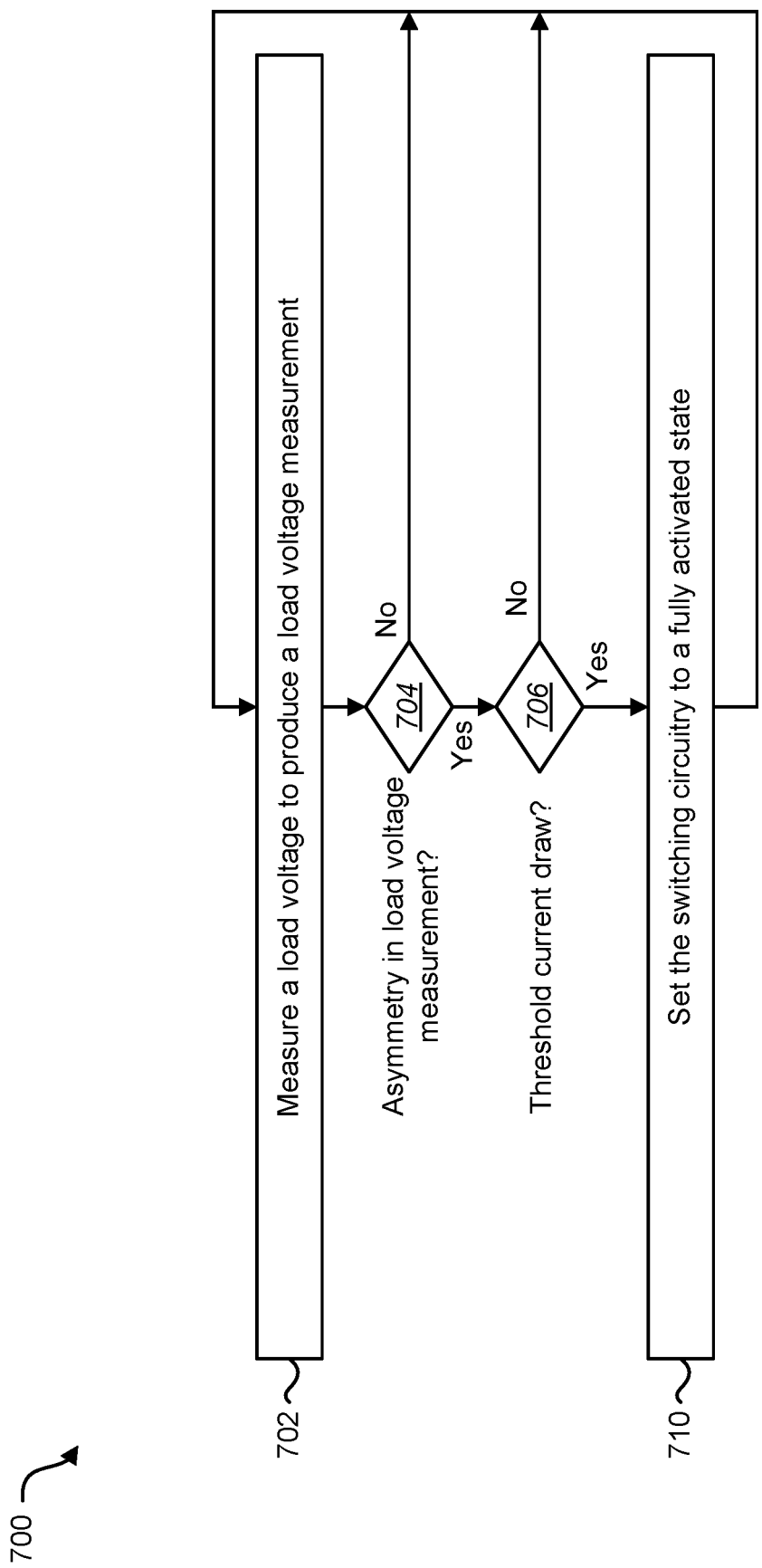
FIG. 7 is a flow diagram illustrating another more specific configuration of a method for detecting switching circuitry failure.

FIG. 7 is a flow diagram illustrating another more specific configuration of a method 700 for detecting switching circuitry failure. The method 700 may be performed by the electronic device 102 described in relation to FIG. 1. The electronic device 102 may measure 702 a load voltage to produce a load voltage measurement. This may be accomplished as described in relation to one or more of FIGS. 1-2 and 4.

The electronic device 102 may determine 704 whether asymmetry is indicated in the load voltage measurement. This may be accomplished as described in relation to one or more of FIGS. 1-6. For example, asymmetry may be detected based on singular polarity in a period of time, lack of zero crossings in a period of time, differing swing widths, and/or other differing swing measures. If asymmetry is not indicated and/or detected, the load voltage measuring 702 may continue (for another time period, one or more swings, one or more switches, one or more cycles, etc., for example).

If asymmetry is indicated in the load voltage measurement, the electronic device 102 may determine 706 whether there is a threshold current draw. This may be accomplished as described in connection with FIG. 1. For example, the electronic device 102 may produce a current measurement (with current measuring circuitry, for example). Determining 706 whether there is a threshold current draw may include determining whether the current measurement is greater than a current draw threshold. The current measurement may correspond to the load voltage measurement. If there is not a threshold current draw, the switching circuitry may continue to operate normally and/or load voltage measuring 702 may continue (for another time period, one or more swings, one or more switches, one or more cycles, etc., for example).

If there is a threshold current draw (e.g., if a threshold current draw is detected), the electronic device 102 may set 710 the switching circuitry to a fully activated state. This may be accomplished as described in relation to one or more of FIGS. 1-6. For example, the electronic device 102 may set the switching circuitry to deliver one or more full AC voltage cycles to the load. In some approaches, the electronic device 102 may provide a fault indication if switching circuitry failure is detected.

Figure 8:
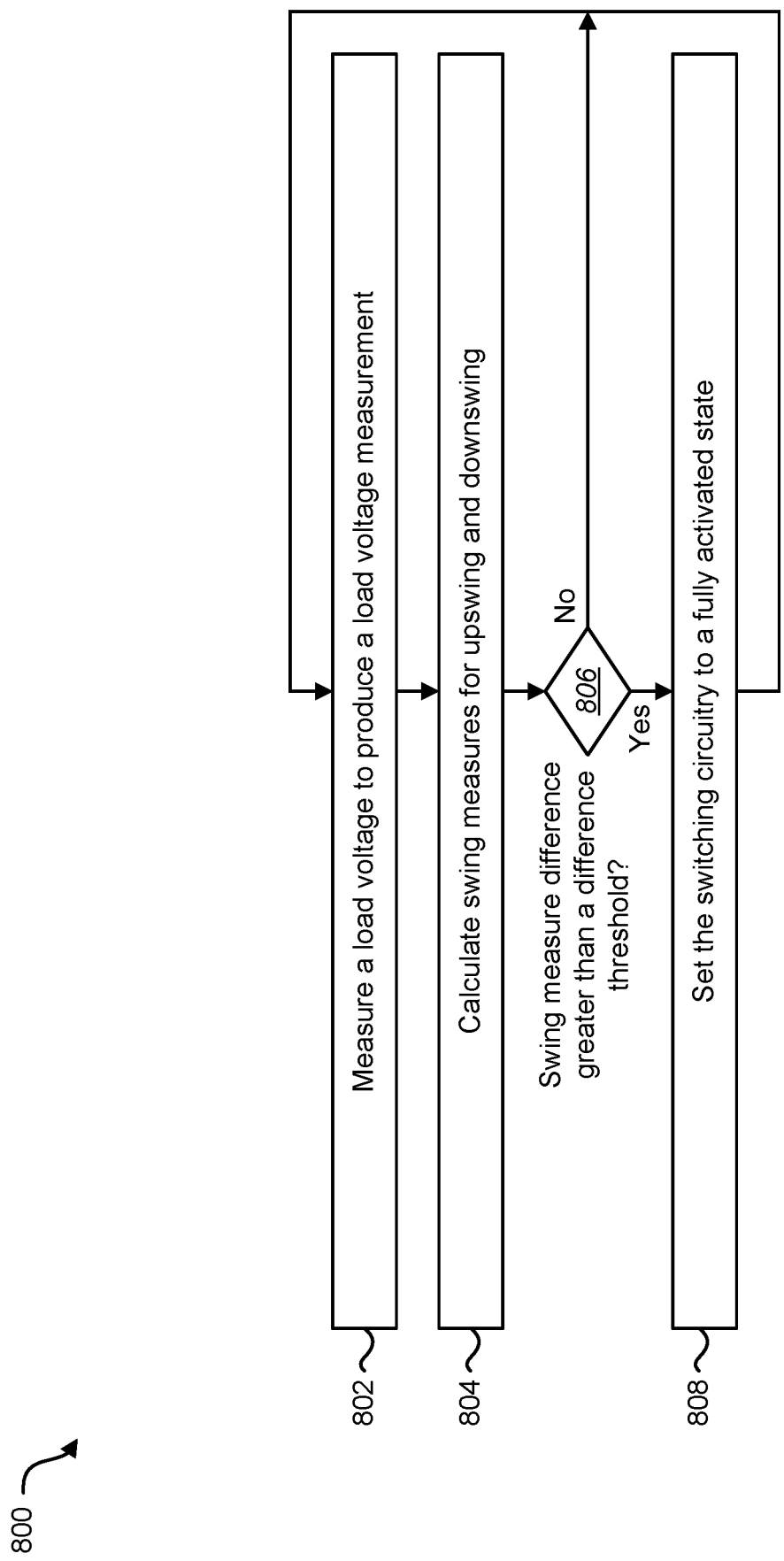
FIG. 8 is a flow diagram illustrating another more specific configuration of a method for detecting switching circuitry failure.

FIG. 8 is a flow diagram illustrating another more specific configuration of a method 800 for detecting switching circuitry failure. The method 800 may be performed by the electronic device 102 described in relation to FIG. 1. The electronic device 102 may measure 802 a load voltage to produce a load voltage measurement. This may be accomplished as described in relation to one or more of FIGS. 1-2, 4, and 7.

The electronic device 102 may calculate 804 swing measures for upswing (e.g., positive swing) and downswing (e.g., negative swing). This may be accomplished as described in relation to FIG. 1. For example, the electronic device 102 (e.g., processor 112) may calculate swing widths, swing areas, swing areas beyond thresholds, average voltages, RMS voltages, etc. For instance, the electronic device 102 may determine a time difference between first and last positive samples (or zero crossings) to determine upswing width and a time difference between first and last negative samples (or zero crossings) to determine downswing width. In another approach, the electronic device 102 may determine a time difference between first and last positive threshold samples to determine upswing width and a time difference between first and last negative threshold samples to determine downswing width. In another approach, the electronic device 102 may determine an integral or area estimate for each of the upswing and the downswing to determine swing areas. In another approach, the electronic device 102 may determine an integral or area estimate for each of the upswing above a positive threshold and of the downswing below a negative threshold to determine swing areas beyond thresholds. In another approach, the electronic device 102 may determine average voltages for each of the upswing and downswing. In another approach, the electronic device 102 may determine RMS voltages for each of the upswing and downswing.

The electronic device 102 may determine 806 whether a swing measure difference is greater than a difference threshold. This may be accomplished as described in relation to FIG. 1. For example, the electronic device 102 may compare the swing measures for the upswing and the downswing. In some approaches, the electronic device 102 may subtract the swing measures and compare the difference (e.g., subtraction) to the difference threshold. In other approaches, the electronic device 102 may determine a ratio between the swing measures and compare the ratio to the difference threshold. It should be noted that the difference threshold may include but may not be limited to a strict subtractive difference. For example, a ratio may be greater than a difference threshold if the ratio indicates a large enough difference (e.g., if the ratio is less than a ratio threshold). If the difference of the swing measures is not greater than a difference threshold, the switching circuitry may continue to operate normally and/or load voltage measuring 802 may continue (for another time period, one or more swings, one or more switches, one or more cycles, etc., for example).

If the swing measure difference is greater than the difference threshold, the electronic device 102 may set 808 the switching circuitry to a fully activated state. This may be accomplished as described in relation to one or more of FIGS. 1-7. For example, the electronic device 102 may set the switching circuitry to deliver one or more full AC voltage cycles to the load. In some approaches, the electronic device 102 may provide a fault indication if switching circuitry failure is detected.

In some configurations, the method 800 described in relation to FIG. 8 may also include determining whether there is a threshold current draw in combination with determining whether the swing measure difference is greater than the difference threshold. This may be accomplished as described in relation to FIG. 7.

Figure 9:
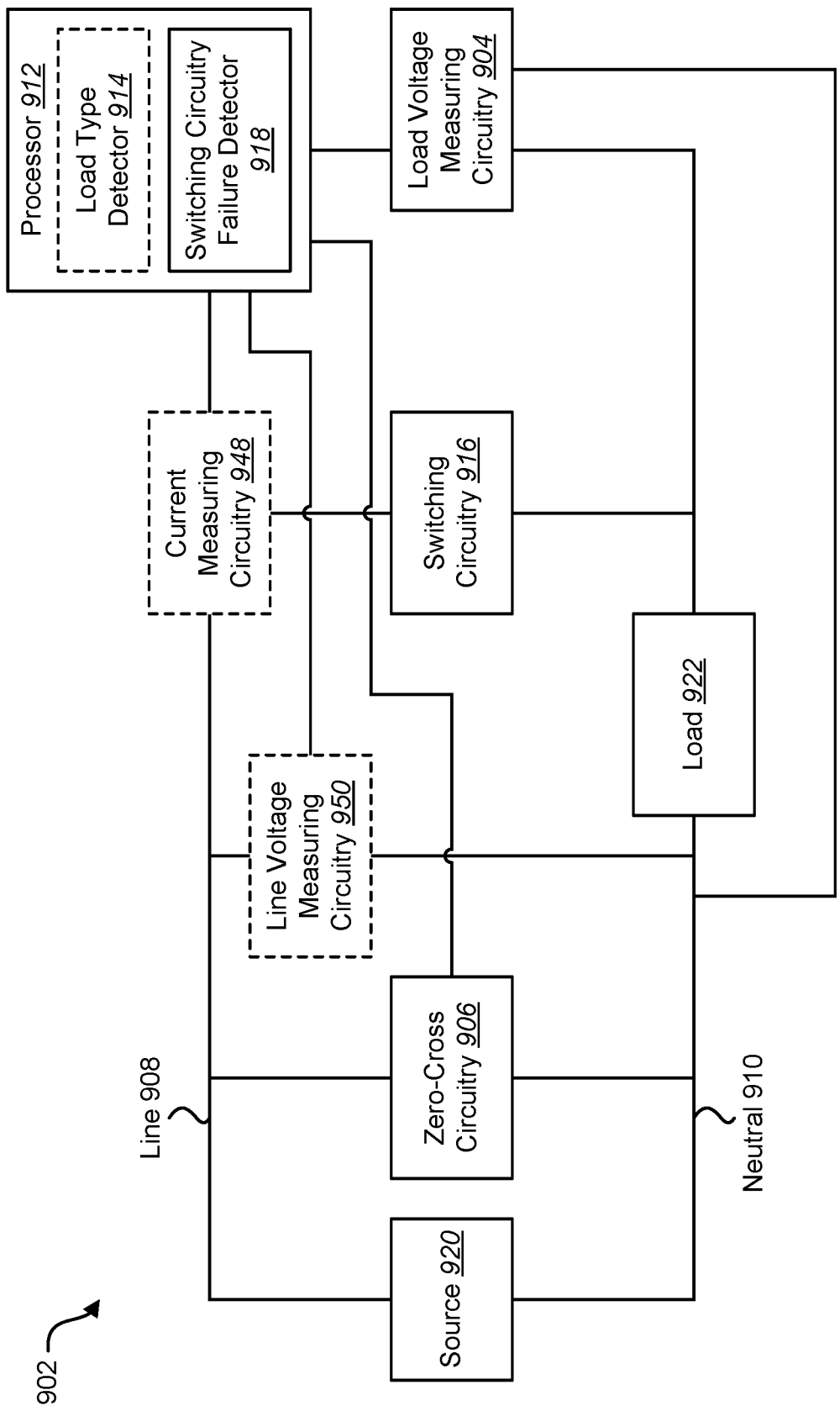
FIG. 9 is a block diagram illustrating a more specific configuration of an electronic device for detecting a load type and controlling switching timing.

FIG. 9 is a block diagram illustrating a more specific configuration of an electronic device 902 for detecting a load type and controlling switching timing. The electronic device 902 may include load voltage measuring circuitry 904, a processor 912, switching circuitry 916, zero-cross circuitry 906, current measuring circuitry 948 (optionally), and/or line voltage measuring circuitry 950 (optionally). The processor 912 may be coupled to the load voltage measuring circuitry 904, to the switching circuitry 916, to the zero-cross circuitry 906, the current measuring circuitry 948, and/or to the line voltage measuring circuitry 950. The electronic device 902 described in relation to FIG. 9 may be an example of the electronic device 102 described in relation to FIG. 1. One or more of the elements or components described in relation to FIG. 9 may function similarly and/or may be implemented similarly to one or more corresponding elements or components described in relation to FIG. 1. For example, the source 920, load 922, zero-cross circuitry 906, switching circuitry 916, processor 912, switching circuitry failure detector 918, and/or load voltage measuring circuitry 904 of FIG. 9 may function and/or may be implemented as described in relation to one or more of the source 120, load 122, zero-cross circuitry 106 switching circuitry 116, processor 112, switching circuitry failure detector 118, and/or load voltage measuring circuitry 104 of FIG. 1. It should be noted that the source 920 and/or the load 922 may be separate from the electronic device 902, may be coupled to the electronic device 902, and/or may not be included in the electronic device 902.

In some configurations, load voltage may be monitored during initialization to determine whether a switching circuitry failure has occurred. Additionally or alternatively, load voltage may be monitored after initialization to determine whether a switching circuitry failure has occurred.

The current measuring circuitry 948 may be optionally configured to measure a current (e.g., a line 908 current) to produce a current measurement (e.g., a current waveform). For example, the current measuring circuitry 948 may continuously capture the current measurement (e.g., current waveform) by sampling the current (on the line 908, for instance) for one or more cycles. The current measuring circuitry 948 may include discrete components. In some configurations, the current measuring circuitry 948 may only include discrete components. The current measuring circuitry 948 may be coupled in line with the feed line 908 so that the current flowing from the source 920 may be determined.

In some configurations, the current measuring circuitry 948 may capture a continuous time (e.g., analog) current waveform. For example, the current measuring circuitry 948 may capture a continuous time current waveform of the current flowing from the source 920 into the electronic device 902. The continuous time current waveform may indicate how the current varies over each cycle of the AC signal. An example of current waveform sampling is described in relation to FIG. 13. In some configurations, the electronic device 902 may additionally include an ADC for capturing a discrete time (e.g., digital) current waveform of the current (e.g., line 908 current) by sampling the continuous time current waveform. For example, the ADC may sample at sufficient intervals to capture how the current varies over one or more cycles. In some configurations, the ADC may sample the current to correspond to the sampling of the load voltage. The digital current waveform may be one example of the current measurement.

In some configurations, load voltage measuring circuitry 904 may be utilized with current measuring circuitry 948 to determine whether a switching circuitry failure has occurred. For example, the load voltage measuring circuitry 904 may be utilized to produce a load voltage measurement. The load voltage measurement may be utilized to determine whether there is an asymmetry in the load voltage measurement. The current measuring circuitry 948 may be utilized to produce a current measurement. The current measurement may be utilized to determine whether there is a current draw (e.g., a threshold current draw) corresponding to the asymmetry in the load voltage measurement. If both criteria are met (e.g., if an asymmetry in the load voltage measurement is detected and a threshold current draw is detected), the switching circuitry failure detector 918 may detect a switching circuitry failure. This may be accomplished as described in relation to FIG. 7.

Utilizing both the asymmetry detection and the current draw detection may help to avoid false failure detections. For example, some load types may exhibit an asymmetry in the load voltage measurement even when a switching circuitry failure has not occurred. However, an asymmetry in the load voltage measurement in combination with a threshold current draw may indicate when an actual switching circuitry failure has occurred with greater certainty.

In a case that a switching circuitry failure is detected, the processor 912 (e.g., switching circuitry failure detector 918) may set the switching circuitry 916 to a fully activated state. This may be accomplished as described in relation to one or more of FIGS. 1-2 and 4-8.

In some approaches, in addition to one or more of the configurations and/or approaches described above, the switching circuitry failure detection routine may be performed (e.g., repeated) a number of times. Each switching circuitry failure detection may indicate whether the switching circuitry 916 has failed. The switching circuitry failure detections may be utilized to make a (final) determination on the load type. In some approaches, a threshold number of agreeing switching circuitry failure detections may need be satisfied in order to make the switching circuitry failure determination. For example, at least three switching circuitry failure detections may be required to agree for the final switching circuitry failure determination. For instance, as soon as a number of (e.g., three) switching circuitry failure detections agree that the switching circuitry 916 has failed, the final switching circuitry failure determination may be that the switching circuitry 916 has failed. In another example, the threshold may require a minimum proportion of switching circuitry failure detections (e.g., a minimum percentage of a minimum number of detections, at least 75% of at least four switching circuitry failure detection routines, etc.). The switching circuitry failure detection routine may be repeated until the one or more criteria are satisfied and/or until a failure threshold is reached. If the failure threshold is reached, a fault indication may be provided (e.g., a fault light may be activated, a fault message may be displayed, a fault message may be communicated to a control system, etc.).

The zero-cross circuitry 906 may detect a line voltage zero cross (e.g., one or more zero cross times for the line voltage). In some configurations, the processor 912 may utilize the line voltage zero cross(ings) to control the switching circuitry 916. For instance, during initialization, switch activation and/or deactivation may initially be coordinated to occur at approximately the same times as line voltage zero crossings.

The line voltage measuring circuitry 950 may be configured to measure a voltage (e.g., a line 908 voltage) to produce a line voltage measurement (e.g., a line voltage waveform). For example, the line voltage measuring circuitry 950 may continuously capture the line voltage measurement (e.g., line voltage waveform) by sampling the voltage (between the line 908 and neutral 910, for instance) for one or more cycles. The line voltage measuring circuitry 950 may include discrete components. In some configurations, the line voltage measuring circuitry 950 may only include discrete components. The line voltage measuring circuitry 950 may be coupled between the feed line 908 and neutral 910 so that line voltage may be determined.

In some configurations, the line voltage measuring circuitry 950 may capture a continuous time (e.g., analog) voltage waveform. For example, the line voltage measuring circuitry 950 may capture a continuous time voltage waveform of the line voltage across the source 920. The continuous time voltage waveform may indicate how the line voltage varies over each cycle of the AC signal. Examples of sampling a voltage waveform are described in relation to FIG. 12. In some configurations, the electronic device 902 may additionally include an ADC for capturing a discrete time (e.g., digital) voltage waveform of the line voltage (e.g., line 908 voltage) by sampling the continuous time voltage waveform. For example, the ADC may sample at sufficient intervals to capture how the voltage varies over one or more cycles. In some configurations, the ADC may sample the line voltage to correspond to the sampling of the load voltage and/or the current. The digital line voltage waveform may be one example of the line voltage measurement. One or more line voltage samples and/or line voltage zero crossings may be stored in memory in some implementations.

In some configurations, the electronic device 902 (e.g., adaptive dimmer) may detect a load type. The load type may be detected in order to determine whether to drive the load 922 in forward phase or reverse phase. For example, inductive loads may be driven in forward phase. Capacitive loads may be driven in reverse phase. Driving capacitive loads in reverse phase may provide one or more benefits, such as extending device life and/or providing improved dimming performance. Resistive loads may be driven in either forward phase or reverse phase. Driving resistive loads in reverse phase may provide one or more benefits, such as reducing inrush current and/or reducing ringing. The load type may be detected during initialization (e.g., during "boot-up," during a load type detection mode, etc.). The load type may be detected based on one or more of a load voltage measurement, a line voltage measurement, and/or a current measurement.

In some configurations, the processor 912 may include an optional load type detector 914 for performing load type detection. In some configurations, the load type detector 914 may perform one or more load type detections. For example, each time the electronic device 902 power cycles (e.g., each time power is initially provided and/or restored to the electronic device 902), the load type detector 914 may detect the load type. In some approaches, load type detection and/or determination may be performed while the electronic device 902 is in an initial set-up mode (e.g., during "boot-up," during initialization, during a detection mode, etc.).

The processor 912 may be configured to control the switching circuitry 916 to drive the load 922 based on the load type. For example, the processor 912 may control the switching circuitry 916 to drive the load 922 in forward phase if the load type is inductive or may control the switching circuitry 916 to drive the load 922 in reverse phase if the load type is capacitive or resistive.

In some configurations, the electronic device 902 (e.g., processor 912) may additionally or alternatively adjust how the load 922 is driven based on the load type. For example, the electronic device 902 may adjust its own impedance to improve the efficiency (e.g., power factor) for the circuit. Thus, the electronic device 902 may determine the load type to enhance the efficiency of the circuit. In some approaches, the processor 912 may adjust the driving voltage waveform and/or current waveform to enhance efficiency (e.g., increase the power factor by adjusting the phase margin). For example, the processor 912 may adjust the duty cycle and/or the amount of power delivered to the load 922 to enhance efficiency (e.g., limiting the watts provided to correspond with the watts consumed).

The zero-cross circuitry 906 may detect a line voltage zero cross (e.g., one or more zero cross times for the line voltage). In some configurations, the one or more line voltage zero crossings may be indicated to the processor 912. For example, the zero-cross circuitry 906 may send a signal (e.g., a step signal, a bit, a code, etc.) to the processor 912 that indicates the timing for the one or more line voltage zero crossings. The processor 912 may utilize the line voltage zero cross(ings) to control the switching circuitry 916. For example, the processor 912 may control the state of the switching circuitry 916 (e.g., one or more states of one or more switches, MOSFETs, etc.) in order to coordinate the switch activation and/or deactivation with line voltage zero cross(ings).

In some configurations, the switching circuitry 916 may be configured to perform switching based on the line voltage zero cross to supply a load voltage (e.g., a load driving voltage when activated). For example, the switching circuitry 916 may perform switching based on a timing of the line voltage zero cross during initialization (e.g., during a "boot-up" mode, during initialization, during load type detection, etc.). For instance, the switching circuitry 916 may switch at (approximately) one or more line voltage zero crossings during load type detection. In some approaches, the switching circuitry 916 may receive a control signal from the processor 912 indicating one or more times to perform switching based on the line voltage zero cross (ings).

In some configurations, for example, the switching circuitry 916 may include two switches (e.g., MOSFETs, MOSFETs with coupled drains, etc.). A first switch may be activated and a second switch may be deactivated at a rising-edge zero cross of the line voltage. The first switch may be deactivated and the second switch may be activated at a falling-edge zero cross of the line voltage. This switching pattern may be performed one or more times for one or more cycles of the line voltage.

It should be noted that the term "difference" and variations thereof as used herein (e.g., a swing measure difference, etc.) may include one or more types of conceptual difference and/or difference measures. For example, a "difference" may mean a mathematical subtraction, a ratio, a comparison (e.g., whether one quantity is greater than, equal to, or less than another quantity), an order (e.g., ranking), and/or a sequence (e.g., whether an event happens before, during, or after another event), etc.

The switching circuitry failure detector 918 may control the switching circuitry 916 based on whether switching circuitry failure is detected as described in relation to one or more of FIGS. 1-2 and 4-8. For example, the switching circuitry failure detector 918 may set the switching circuitry 916 in a fully activated state in a case that switching circuitry failure is detected. Additionally or alternatively, the switching circuitry failure detector 918 may provide an indication (e.g., fault indication) of switching circuitry failure. For example, the switching circuitry failure detector 918 may activate a fault indicator light and/or may send a fault indicator message to another device.

It should be noted that one or more of the elements or components described in relation to FIG. 9 may be combined and/or divided in some configurations. For example, the zero-cross circuitry 906, switching circuitry 916, processor 912, load voltage measuring circuitry 904, current measuring circuitry 948, and/or line voltage measuring circuitry 950 may be divided into smaller elements or components that perform a subset of the functions described herein. Additionally or alternatively, one or more of the zero-cross circuitry 906, switching circuitry 916, processor 912, load voltage measuring circuitry 904, current measuring circuitry 948, and/or line voltage measuring circuitry 950 may be combined. For example, the line voltage measuring circuitry 950 may be combined with the zero-cross circuitry 906 in some configurations. Alternatively, the line voltage zero cross may be determined (by the line voltage measuring circuitry 950 and/or the processor 912) based on the line voltage measurement (e.g., line voltage waveform).

Figure 10:
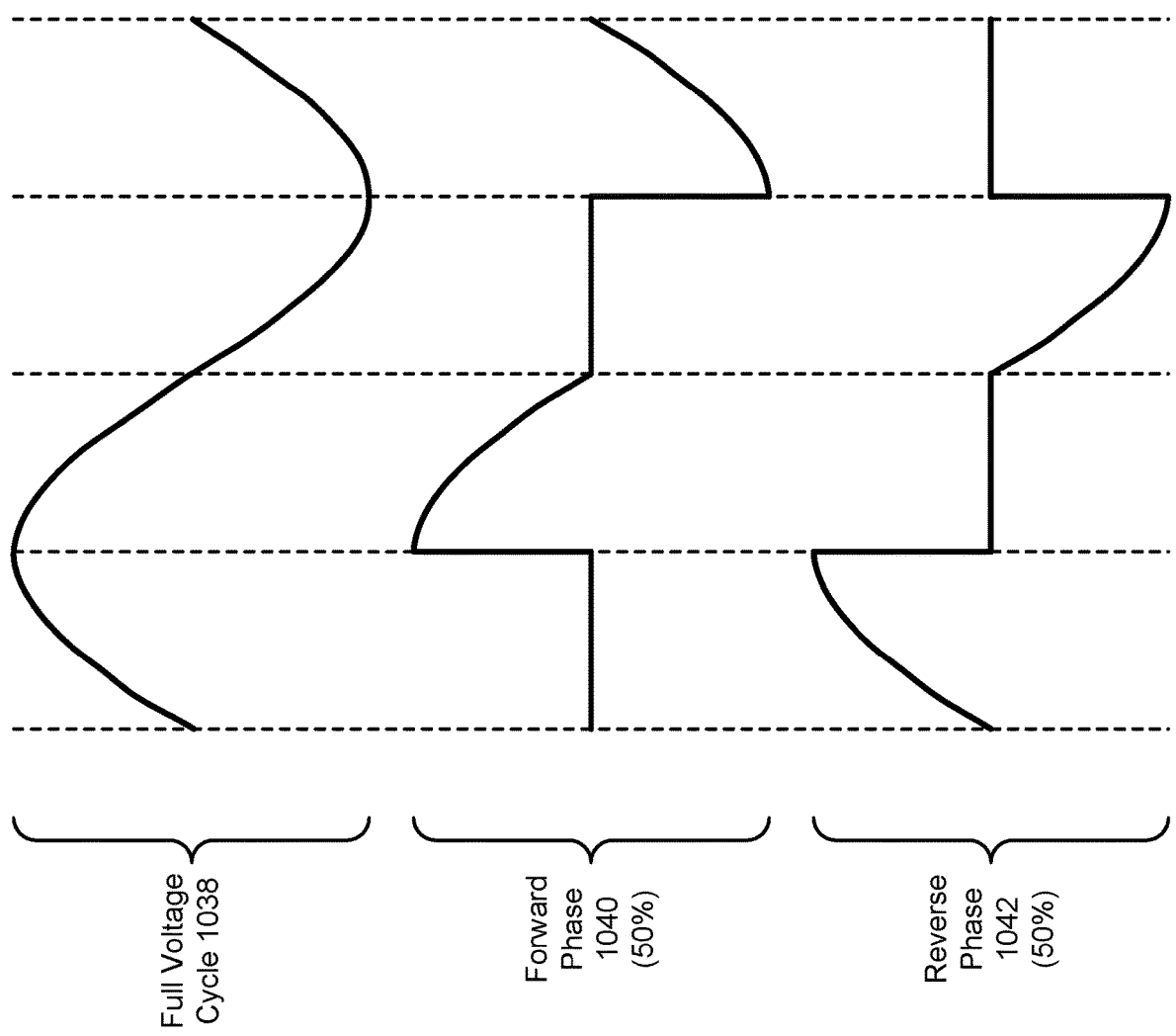
FIG. 10 is a diagram illustrating an example of a forward phase voltage waveform and a reverse phase voltage waveform.
Figure 12:
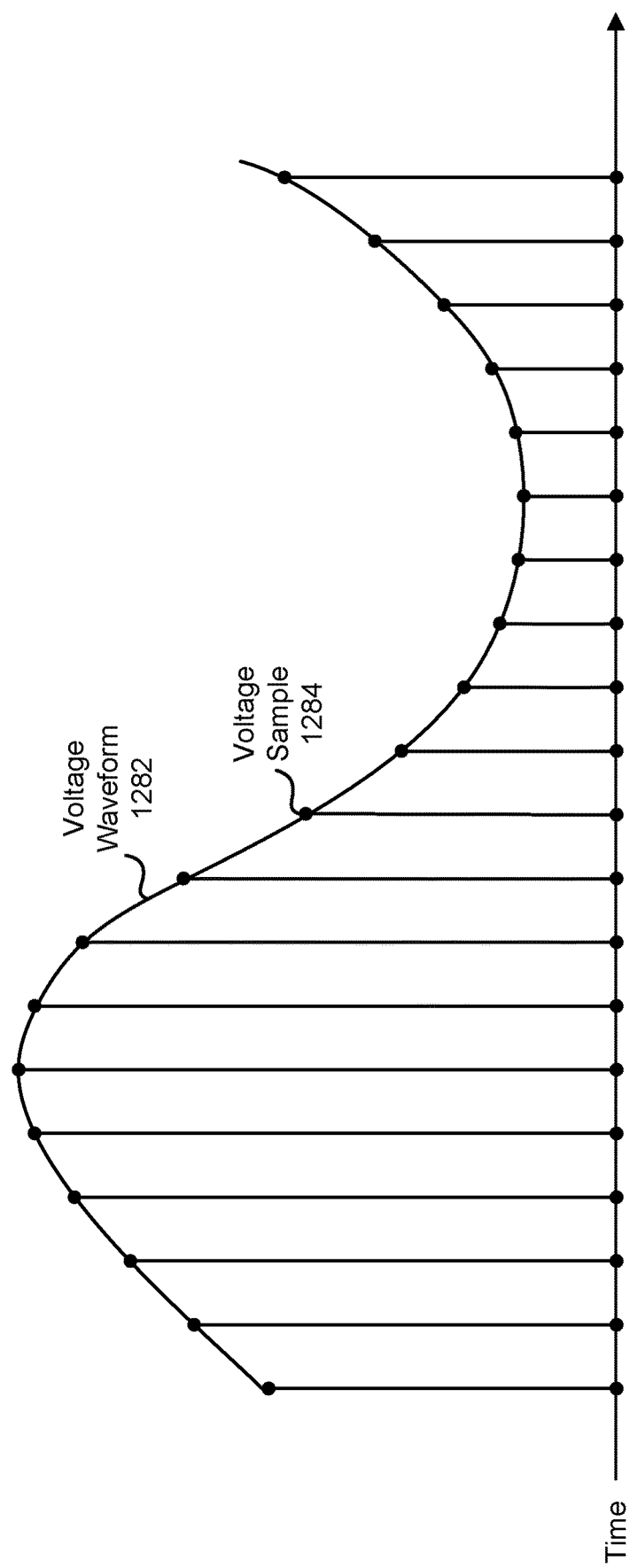
FIG. 12 illustrates an example of a voltage waveform.

FIG. 10 is a diagram illustrating an example of a forward phase 1040 voltage waveform and a reverse phase 1042 voltage waveform. In particular, FIG. 12 illustrates an example of a full voltage cycle 1038 for an AC voltage. Some devices (e.g., phase-cut dimmers) may cut (e.g., switch off) one or more portions of a voltage cycle in order to drive a load at a particular level (e.g., power, voltage, etc.). For example, a "front" (e.g., initial) part of the upswing or downswing of a voltage cycle may be cut to drive a load in forward phase. A "back" (e.g., latter) part of the upswing or downswing of a voltage cycle may be cut to drive a load in reverse phase. Different amounts (e.g., proportions) of the voltage cycle may be cut in order to drive the load at different levels (e.g., different power levels).

In the forward phase 1040 example illustrated in FIG. 10, the full voltage cycle 1038 is cut by 50% in order to drive a load at a 50% level. As shown by the forward phase 1040 example, half of the front (e.g., initial) part of the upswing is cut (e.g., switched off) and half of the front part of the downswing is cut (e.g., switched off). As described herein, it may be beneficial to drive inductive loads in forward phase.

In the reverse phase 1042 example illustrated in FIG. 10, the full voltage cycle 1038 is cut by 50% in order to drive a load at a 50% level. As shown by the reverse phase 1042 example, half of the back (e.g., latter) part of the upswing is cut (e.g., switched off) and half of the back part of the downswing is cut (e.g., switched off). As described herein, it may be beneficial to drive resistive loads and/or capacitive loads in reverse phase.

When switching circuitry fails as described herein, the part of the upswing or downswing that should be cut to ensure symmetry may not be cut. This asymmetry may be utilized to detect switching circuitry failure as described herein.

Figure 11:
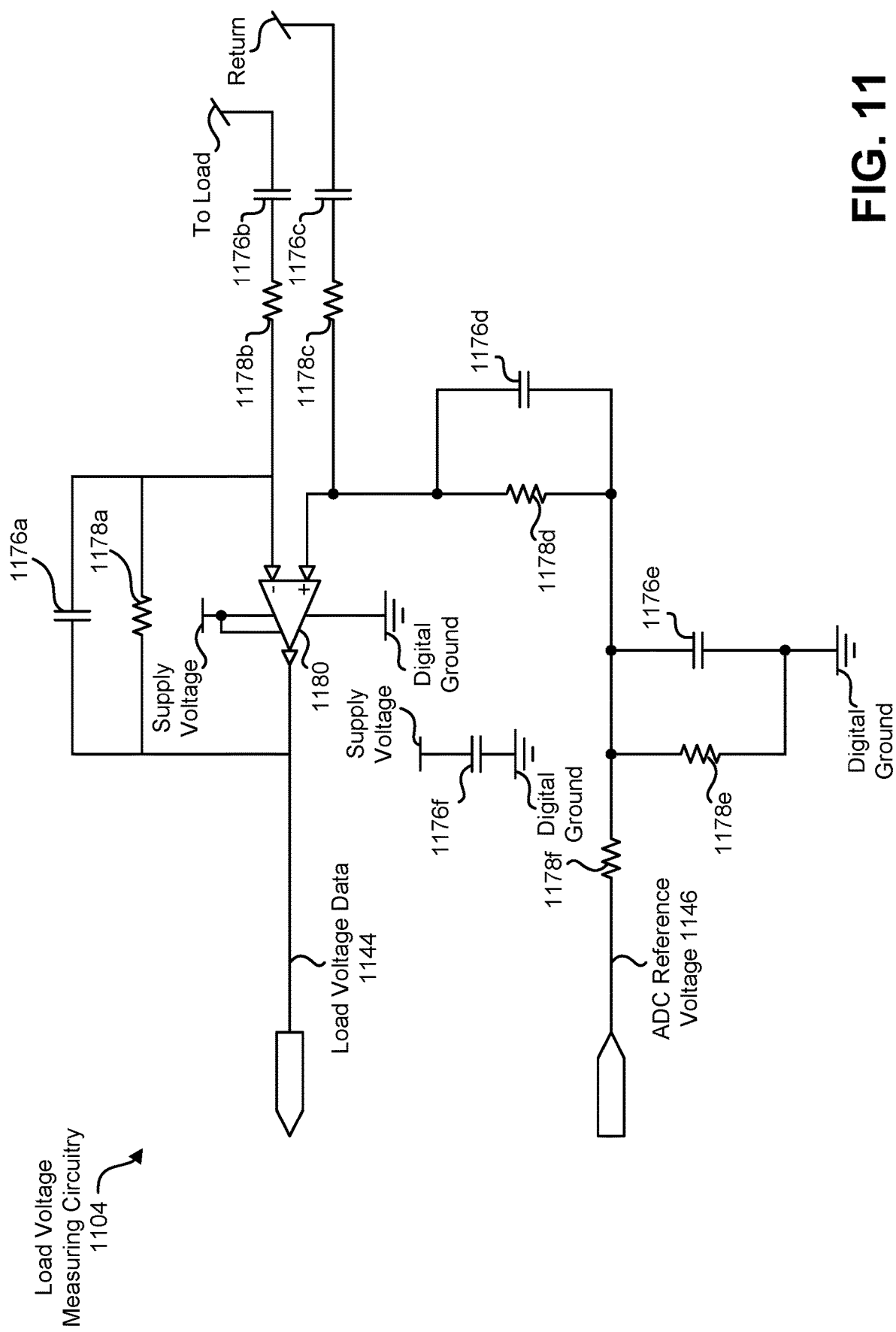
FIG. 11 is a circuit diagram illustrating one example of load voltage measuring circuitry that may be implemented in accordance with some configurations of the systems and methods disclosed herein.

FIG. 11 is a circuit diagram illustrating one example of load voltage measuring circuitry 1104 that may be implemented in accordance with some configurations of the systems and methods disclosed herein. As illustrated in FIG. 11, the load voltage measuring circuitry 1104 may include capacitors 1176a-f, resistors 1178a-f, and an amplifier 1180. The load voltage measuring circuitry 1104 may include a load coupling (e.g., terminal) and a return (e.g., neutral) coupling (e.g., terminal). The load voltage measuring circuitry 1104 may be coupled to a supply voltage (e.g., 3 V) and to digital ground. The load voltage measuring circuitry 1104 may receive an ADC reference voltage 1146. The ADC reference voltage 1146 may be a reference voltage (e.g., 1.2 V) from a processor in some configurations.

In some configurations, example values for the capacitors 1176a-f and resistors 1178a-f may be given as follows. Capacitor A 1176a may have a 10 picofarad (pf) capacitance, capacitor B 1176b may have a 22 microfarad (μF) capacitance, capacitor C 1176c may have a 22 μF capacitance, capacitor D 1176d may have a 10 pf capacitance, capacitor E 1176e may have a 47 μF capacitance, and/or capacitor F 1176f may have a 0.1 μF capacitance. Resistor A 1178a may have a 3.3 kiloohm (kΩ) resistance, resistor B 1178b may have a 3.3 megaohm (MΩ) resistance, resistor C 1178c may have a 3.3 MΩ resistance, resistor D 1178d may have a 3.3 kΩ resistance, resistor E 1178e may have a 10 kΩ resistance, and/or resistor F 1178f may have a 10 kΩ resistance. The load voltage measuring circuitry 1104 may measure (e.g., sample) the load voltage between the load and the return couplings. For example, the amplifier 1180 may provide load voltage data 1144 (e.g., one or more load voltage samples) to a processor. The load voltage data 1144 may provide or be an example of the load voltage measurement described herein. For example, a series of load voltage data 1144 (over one or more cycles, for example) may provide a load voltage measurement. The load voltage measuring circuitry 1104 may take the differential between return and load. The differential may be direct current (DC) decoupled and then amplified to be centered between the ADC reference voltage.

FIG. 12 illustrates an example of a voltage waveform 1282. The voltage waveform 1282 may correspond to a continuous alternating current (AC) voltage signal. The voltage waveform 1282 may be captured by sampling the continuous AC signal to produce a discrete (e.g., digital) signal. For example, the voltage waveform 1282 may include multiple voltage samples 1284. Each voltage sample 1284 may correspond to a voltage amplitude measured at discrete time intervals. Therefore, each voltage sample 1284 may be associated with a particular voltage amplitude and a particular time.

In some configurations, the voltage waveform 1282 may be captured by one or more of the electronic devices described herein. For example, load voltage measurement circuitry may continuously capture the voltage waveform 1282 by sampling the voltage waveform 1282 for one or more cycles of AC. For example, the load voltage measurement circuitry may sample the voltage waveform 1282 across a load. In some configurations, line voltage measurement circuitry may similarly sample a voltage waveform between a line feed and neutral. The electronic device may use an ADC for capturing a discrete time (e.g., digital) voltage waveform 1282 of the AC signal by sampling the continuous time voltage waveform 1282 captured by the voltage sensor. In some implementations, the electronic device may place the voltage samples 1284 in memory (e.g., on-board processor memory, separate memory, etc.) for use in detecting a switching circuitry failure. In some configurations, a processor (e.g., processor 112, processor 1012, etc.) may include a set of program instructions for utilizing the load voltage measuring circuitry to capture the voltage waveform 1282.

Figure 13:
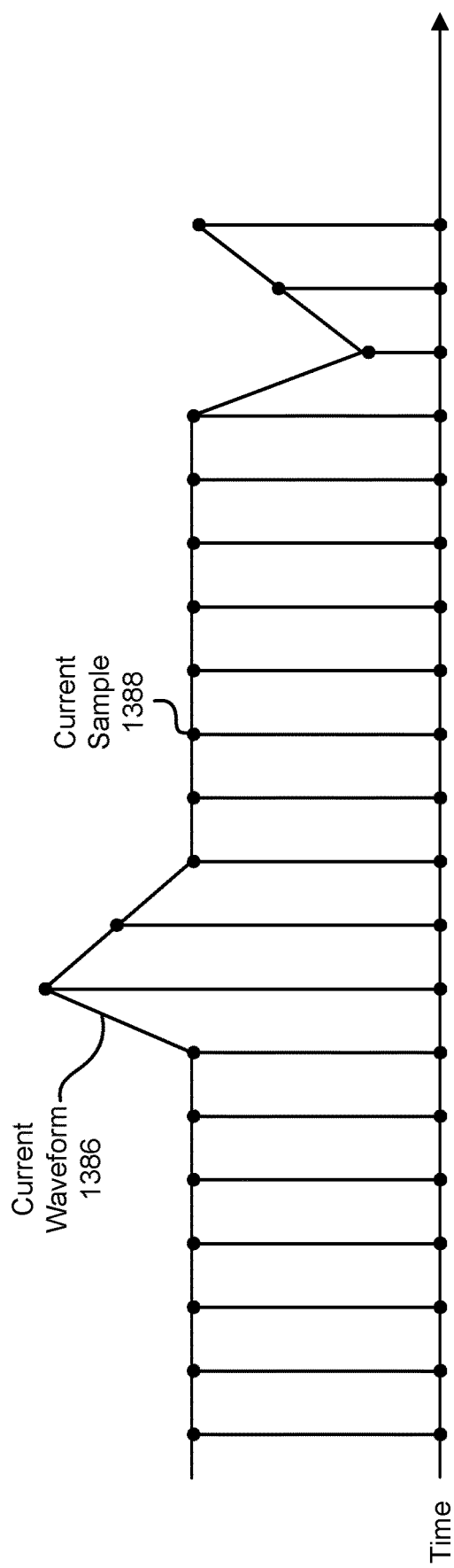
FIG. 13 illustrates an example of a current waveform.

FIG. 13 illustrates an example of a current waveform 1386. The current waveform 1386 may correspond to a continuous alternating current (AC) signal. The current waveform 1386 may be captured by sampling the continuous AC signal to produce a discrete (e.g., digital) signal. For example, the current waveform 1386 may include multiple current samples 1388. Each current sample 1388 may correspond to current amplitude measured at discrete time intervals. Therefore, each current sample 1388 may be associated with a particular current amplitude and a particular time.

In one configuration, the current waveform 1386 may be captured by an electronic device (e.g., current measuring circuitry) as described herein. For example, current measuring circuitry may continuously capture the current waveform 1386 by sampling the current waveform 1386 for one or more cycles of AC. The current measuring circuitry may capture a continuous time current waveform 1386 of the current from the source. The electronic device may use an ADC for capturing a discrete time (e.g., digital) current waveform 1386 of the AC signal by sampling the continuous time current waveform 1386 captured by the current measuring circuitry. In some configurations, the electronic device may place the current samples 1388 in memory (e.g., on-board processor memory, separate memory, etc.) for use in detecting a load type. In some configurations, a processor (e.g., processor 112) may include a set of program instructions for utilizing the current measuring circuitry to capture the current waveform 1386.

Figure 14:
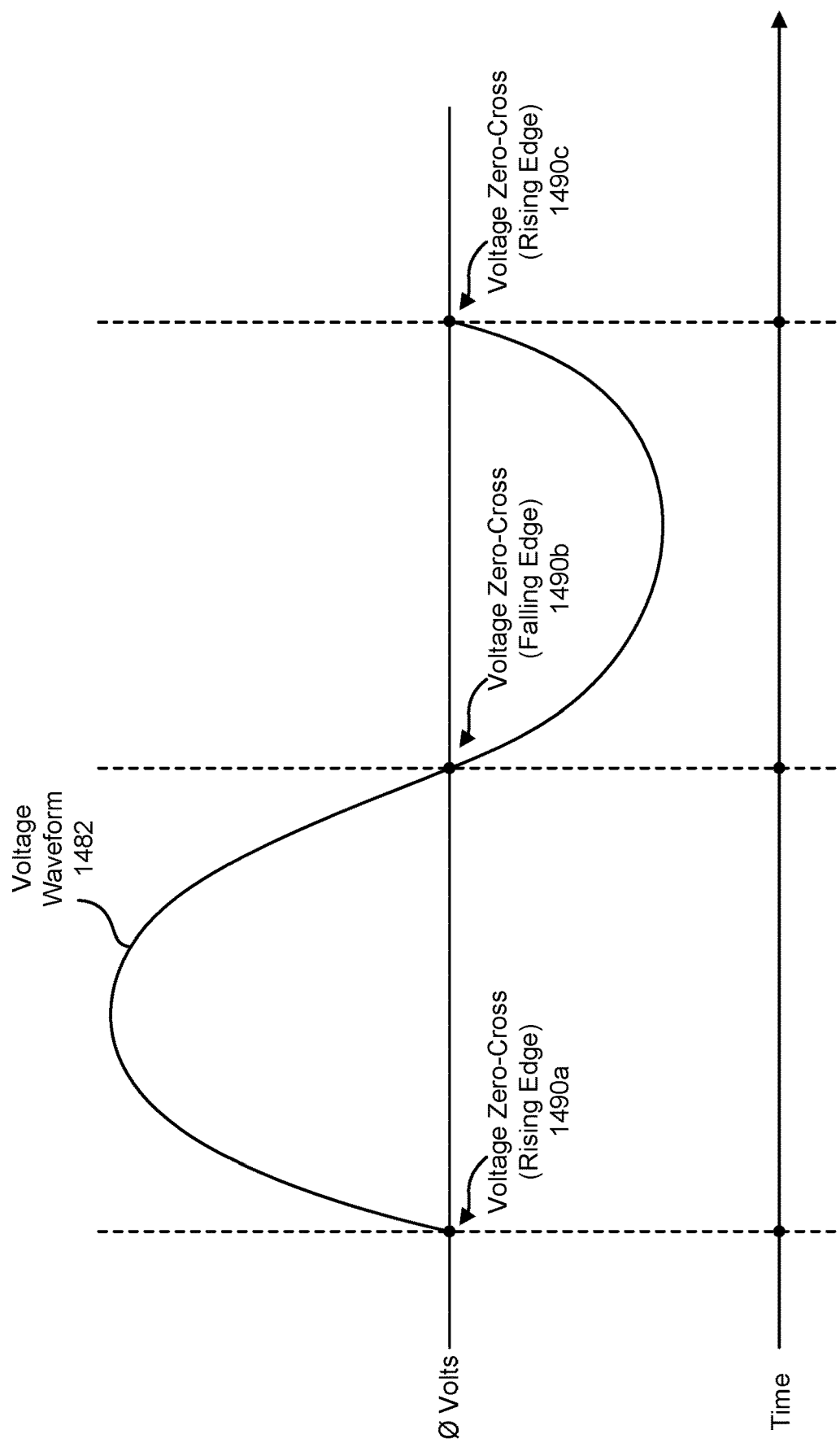
FIG. 14 illustrates multiple examples of voltage zero crossings associated with a voltage waveform.

FIG. 14 illustrates multiple examples of voltage zero crossings 1490 associated with a voltage waveform 1482. The voltage waveform 1482 may correspond to an alternating current (AC) signal. As the polarity of the AC signal alternates between positive and negative over an AC cycle, the voltage waveform 1482 will cross a zero-point where the value of the voltage is zero. The time corresponding to the point when the value of the voltage is zero is the voltage zero cross 1490. If the voltage is increasing when the voltage waveform 1482 crosses the zero point, the voltage zero cross 1490 is a rising edge voltage zero cross 1490*a, c*. If the voltage is decreasing when the voltage waveform 1482 crosses the zero-point, the voltage zero cross 1490 is a falling edge voltage zero cross 1490*b*.

The voltage waveform 1482 may be captured by sampling the continuous AC signal to produce a discrete (e.g., digital) signal as described above in relation to FIG. 12. The sampled voltage waveform 1482 may be stored in memory. The electronic device 102 may obtain the voltage zero cross 1490 based on the sampled voltage waveform 1482. For example, the electronic device 102 may determine when the value of the voltage changes sign (e.g., from positive to negative). The time associated with the voltage sample following the change in voltage sign may be the voltage zero cross 1490. Additionally or alternatively, the electronic device (e.g., electronic device 102, electronic device 1002) may include a simple AC circuit that produces a pulse each time the voltage waveform 1482 crosses zero volts in some configurations.

Figure 15:
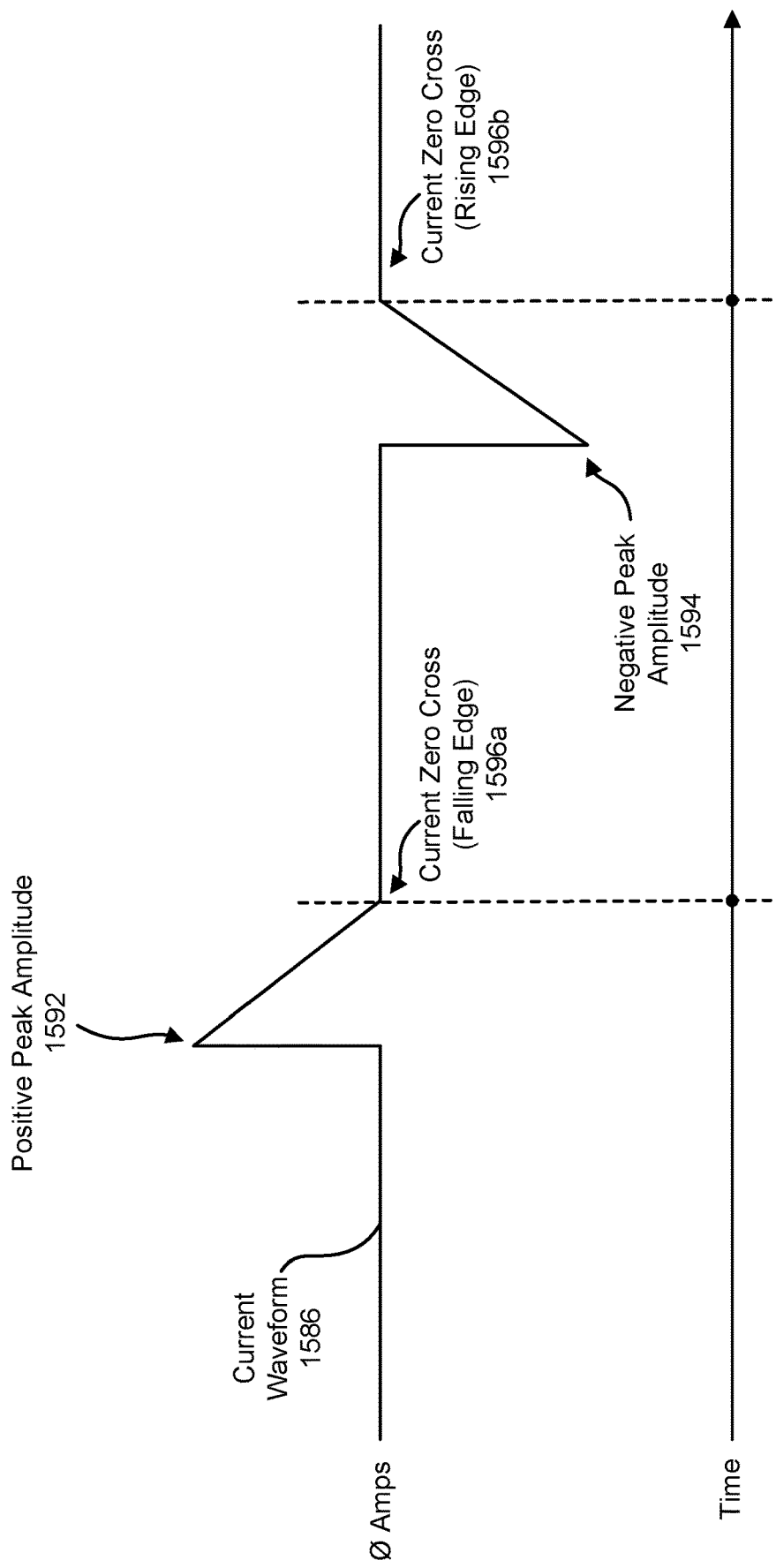
FIG. 15 illustrates multiple examples of current zero crossings associated with a current waveform.

FIG. 15 illustrates multiple examples of current zero crossings 1596 associated with a current waveform 1586. The current waveform 1586 may correspond to an alternating current (AC) signal. As the polarity of the AC signal alternates between positive and negative over an AC cycle, the current waveform 1586 will also alternate between positive and negative values. The current zero cross 1596 occurs at the time where the current is zero following an earlier point where the current is non-zero for a measurable duration. Therefore, the current zero cross 1596 may be the first point when the amplitude of the current is zero following a peak (positive or negative) current amplitude. For example, in FIG. 15, the value of the current is initially zero and then rises to a positive peak amplitude 1592 and decreases to zero amps. In this example, the current zero cross 1596*a* is the first time when the current equals zero after rising to the measurable positive peak amplitude 1592. If the current is decreasing (from a positive peak amplitude 1592, for instance) when the current waveform 1586 equals zero, the current zero cross 1596 is a falling edge current zero cross 1596*a*. If the current is increasing (from a negative peak amplitude 1594, for instance) when the current waveform 1586 equals zero, the current zero cross 1596 is a rising edge current zero cross 1596*b*.

The current waveform 1586 may be captured by sampling the continuous AC signal to produce a discrete (e.g., digital) signal as described above in relation to FIG. 13. The sampled current waveform 1586 may be stored in memory. An electronic device (e.g., electronic device 102) may obtain the current zero cross 1596 based on the sampled current waveform 1586. For example, the electronic device 102 may determine when the value of the current initially changes from zero to non-zero. The electronic device may then determine when the current reaches zero again. The time associated with the current reaching zero may be the current zero cross 1596. In some configurations, the electronic device 102 may utilize an analog-to-digital converter (ADC) to capture the current waveform and determine the current zero cross 1596.

Figure 16:
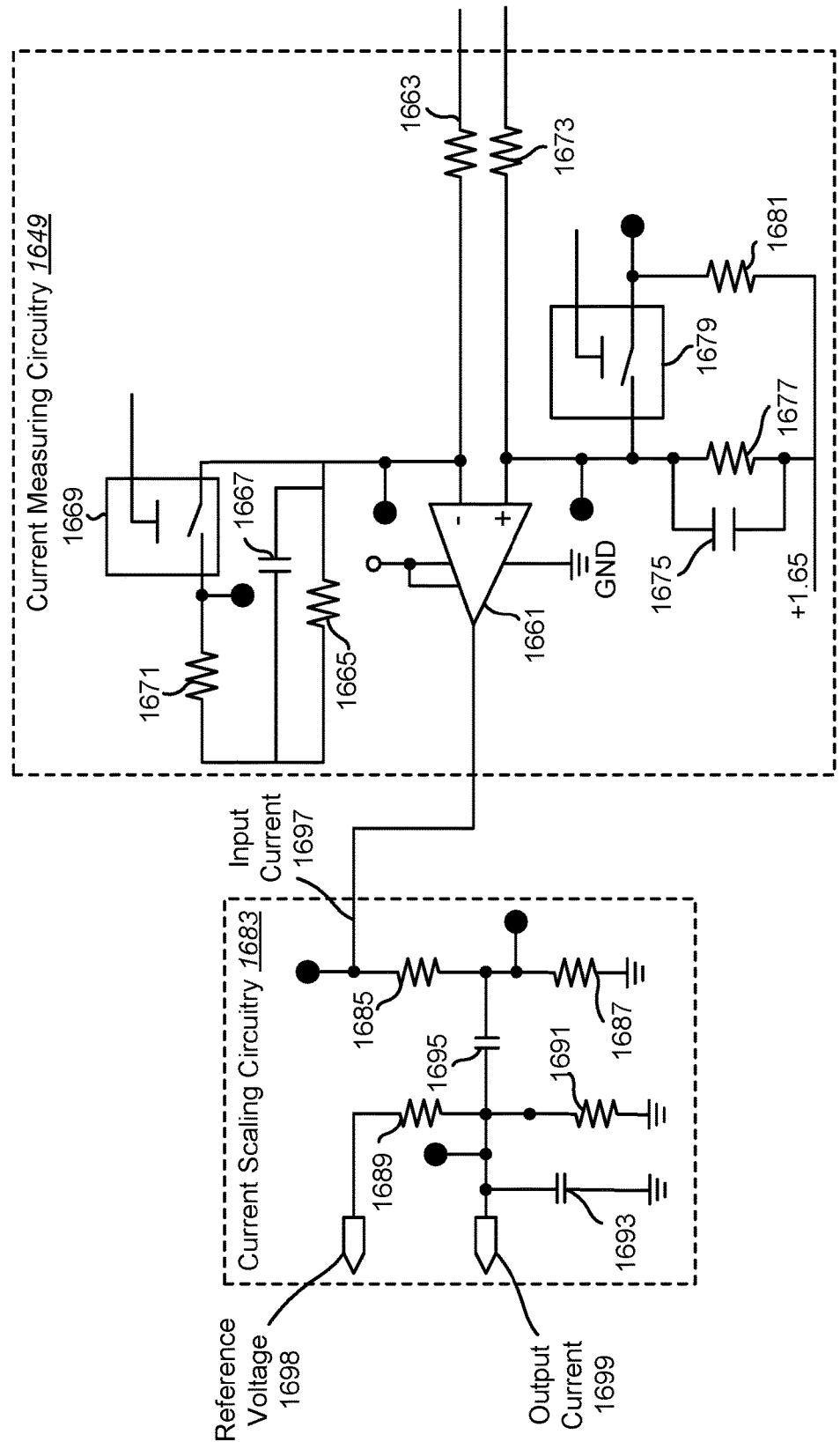
FIG. 16 is a circuit diagram illustrating one configuration of circuitry that may be implemented in one or more of the current measuring circuitries described herein.

FIG. 16 is a circuit diagram illustrating one configuration of circuitry that may be implemented in one or more of the current measuring circuitries described herein (e.g., current measuring circuitry 948, etc.). In some configurations, the current measuring circuitry 948 may include circuitry to implement a current measuring circuitry 1649.

The circuitry of FIG. 16 shows one configuration of resistors, capacitors, and other discrete components that may be implemented within the current measuring circuitry 1649. For example, the current measuring circuitry 1649 may include an amplifier 1661. The amplifier 1661 may be coupled to a supply voltage and to ground. The output of the amplifier 1661 may be coupled to other components within an electronic device (e.g., electronic device 102, electronic device 902, etc.). The negative input of the amplifier 1661 may be coupled to a first resistor 1663. The negative input of the amplifier 1661 may also be coupled to other components within the electronic device. The negative input of the amplifier 1661 may also be coupled to a second resistor 1665 and a first capacitor 1667 in parallel. The negative input of the amplifier 1661 may also be coupled to a first analog switch 1669 connected to a third resistor 1671 and other components within the electronic device. The first analog switch 1669 and the third resistor 1671 may be in parallel to the first capacitor 1667 and the second resistor 1665. The positive input of the amplifier 1661 may be coupled to a fourth resistor 1673. The positive input of the amplifier 1661 may be coupled to other components within the electronic device. The positive input of the amplifier 1661 may also be coupled to a second capacitor 1675 and a fifth resistor 1677 in parallel. The positive input of the amplifier 1661 may also be coupled to a second analog switch 1679, which is coupled to a sixth resistor 1681. The second analog switch 1679 and the sixth resistor 1681 may be in parallel to the fifth resistor 1677 and the second capacitor 1675. The second capacitor 1675, fifth resistor 1677, and sixth resistor 1681 may be coupled to a reference voltage between the supply voltage and the ground.

The current measuring circuitry 1649 may include a first analog switch 1669 and a second analog switch 1679. The analog switches 1669, 1679 may be used to control a threshold value of current flowing through the electronic device. For example, a specific load 122 may have an inrush current and settling time specifications that indicate different levels of current that may safely flow through the electronic device at a given time of operation. The analog switches 1669, 1679 may be used to modify a threshold value based on an appropriate amount of current that should be allowed to pass through the electronic device. The analog switches 1669, 1679 may be adjusted multiple times during operation of a load to adjust for current variations.

In some configurations, the current measuring circuitry may also include circuitry to implement current scaling circuitry 1683. The current scaling circuitry 1683 may be implemented in some configurations of the current measuring circuitry described herein. For example, the current scaling circuitry 1683 may interface between current measuring circuitry 1649 and a processor (e.g., microprocessor). The current scaling circuitry 1683 may include a network of resistors for scaling a current. The network of resistors may include a first resistor 1685, second resistor 1687, third resistor 1689, and fourth resistor 1691. The first resistor 1685 may be coupled to other components within the electronic device. The first resistor 1685 may also be coupled to the second resistor 1687. The second resistor 1687 may be coupled to ground. The third resistor 1689 may be coupled to a reference voltage 1698. The third resistor 1689 may also be coupled to the fourth resistor 1691, and/or to other components within the electronic device. The fourth resistor 1691 may be coupled in parallel to a first capacitor 1693 and a current reference. The fourth resistor 1691 and first capacitor 1693 may each be coupled to ground. Each of the first resistor 1685, second resistor 1687, third resistor 1689, and fourth resistor 1691 may be coupled together via a second capacitor 1695. The inputs of the current scaling circuitry 1683 may include an input current 1697 (from the current measuring circuitry 1649, for instance). The outputs of the current scaling circuitry 1683 may include an output current 1699 and a reference voltage 1698.

Figure 17:
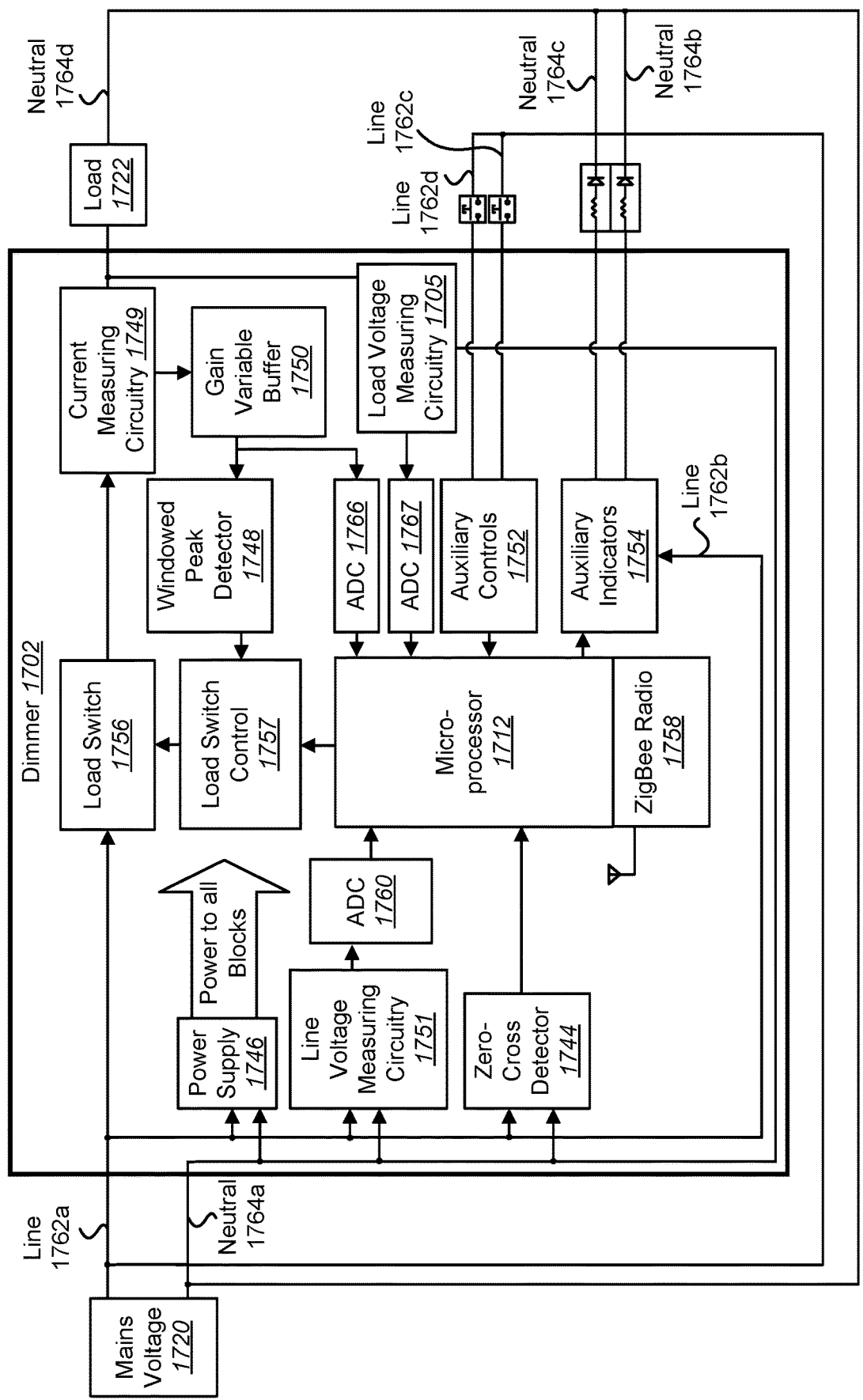
FIG. 17 is a block diagram illustrating one configuration of a dimmer in which systems and methods for detecting switching circuitry failure may be implemented.

FIG. 17 is a block diagram illustrating one configuration of a dimmer 1702 in which systems and methods for detecting switching circuitry failure may be implemented. The dimmer 1702 of FIG. 17 may be one example of the electronic device 102 described above in connection with FIG. 1. In some configurations, one or more of the elements described in connection with FIG. 17 may be configured with similar functionality to corresponding elements described herein.

The dimmer 1702 may receive a voltage waveform from a mains voltage 1720. The dimmer 1702 may also include an internal power supply 1746 coupled to the mains voltage 1720 that provides power to each module/block within the dimmer 1702. The mains voltage 1720 may provide power to the dimmer 1702 via a line 1762a-d coupled to a load switch 1756, a power supply 1746, a line voltage measuring circuitry 1751, a zero-cross detector 1744, auxiliary indicators 1754, and/or auxiliary controls 1752. The mains voltage 1720 may also be coupled to the power supply 1746, the line voltage measuring circuitry 1751, the zero-cross detector 1744, the auxiliary indicators 1754, and a load 1722 via a neutral line 1764a-d. The neutral line 1764a-d may be a return line for different modules/blocks within the dimmer 1702 providing a return to a ground reference voltage.

The dimmer 1702 may include a microprocessor 1712. The microprocessor 1712 may include some or all of the components of one or more of the processors (e.g., processor 112, 912, etc.) described herein. The microprocessor 1712 may include or be coupled to a ZigBee radio 1758. The ZigBee radio 1758 may be used for communicating with other electronic devices (e.g., a control system, other devices, etc.). The line voltage measuring circuitry 1751 may be coupled to the microprocessor 1712 via an ADC 1760. Load voltage measuring circuitry 1705 may be coupled across the load 1722 (if any). The load voltage measuring circuitry 1705 may be coupled to the microprocessor 1712 via a third ADC 1767. The current measuring circuitry 1749 may be coupled to the microprocessor 1712 via a second ADC 1766. The current measuring circuitry 1749 may also be coupled to a gain variable buffer 1750. The gain variable buffer 1750 may be coupled to a windowed peak detector 1748 and the second ADC 1766. In some configurations, the ADCs 1760, 1766, 1767 are part of the microprocessor 1712. The microprocessor 1712 may also be coupled to the zero-cross detector 1744, the auxiliary controls 1752, and the auxiliary indicators 1754. The microprocessor 1712 may also be coupled to the load switch 1756 for engaging or disengaging the load 1722 via instruction from a load switch control 1757.

Figure 18:
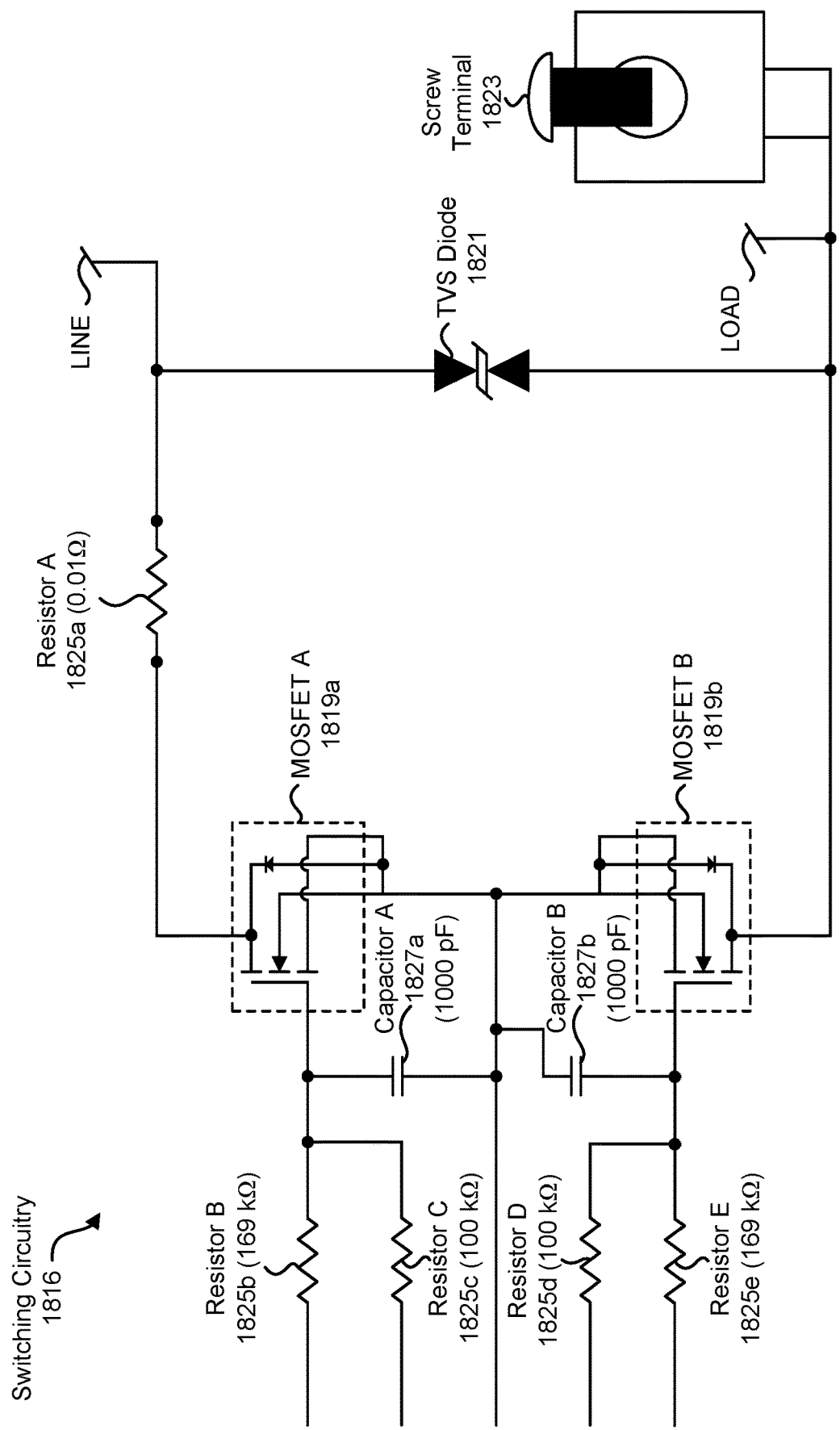
FIG. 18 is a diagram illustrating one example of switching circuitry that may be implemented in accordance with the systems and methods disclosed herein.

FIG. 18 is a diagram illustrating one example of switching circuitry 1816 that may be implemented in accordance with the systems and methods disclosed herein. The switching circuitry 1816 may be an example of one or more of the switching circuitries 116, 916 described herein. In this example, the switching circuitry 1816 includes MOSFET A 1819a, MOSFET B 1819b, resistor A 1825a, resistor B 1825b, resistor C 1825c, resistor D 1825d, resistor E 1825e, capacitor A 1827a, capacitor B 1827b, a transient-voltage-suppression (TVS) diode 1821, and a screw terminal 1823. It should be noted that the values for the resistors and capacitors given in FIG. 18 may be examples. Other values may be implemented. The switching circuitry 1816 may be coupled to a line (e.g., line voltage) and to a load. When an AC signal is applied to the line (e.g., 120 V, 230 V, etc.), MOSFET A 1819a will conduct in the positive phase and MOSFET B 1819b will conduct in the negative phase if the gates of the MOSFETs 1819a-b are enabled (Vgs is satisfied). When the gates of the MOSFETs 1819a-b are not enabled, the MOSFETs 1819a-b will not activate (e.g., turn on) and will block the positive and negative AC voltage. When one of the MOSFETs 1819a-b fails, an asymmetric (e.g., half) AC waveform may result. Examples of waveforms resulting from failed MOSFETs when the gate is disabled are given in FIG. 3 (e.g., switching circuitry failure example A 326 and switching circuitry failure example B 328). The waveform may be in the positive or negative phase based on which one of the MOSFETs 1819a-b fails. Enabling the gate may produce a full cycle waveform (as illustrated in the full cycle example 324 of FIG. 3, for example).

Figure 19:
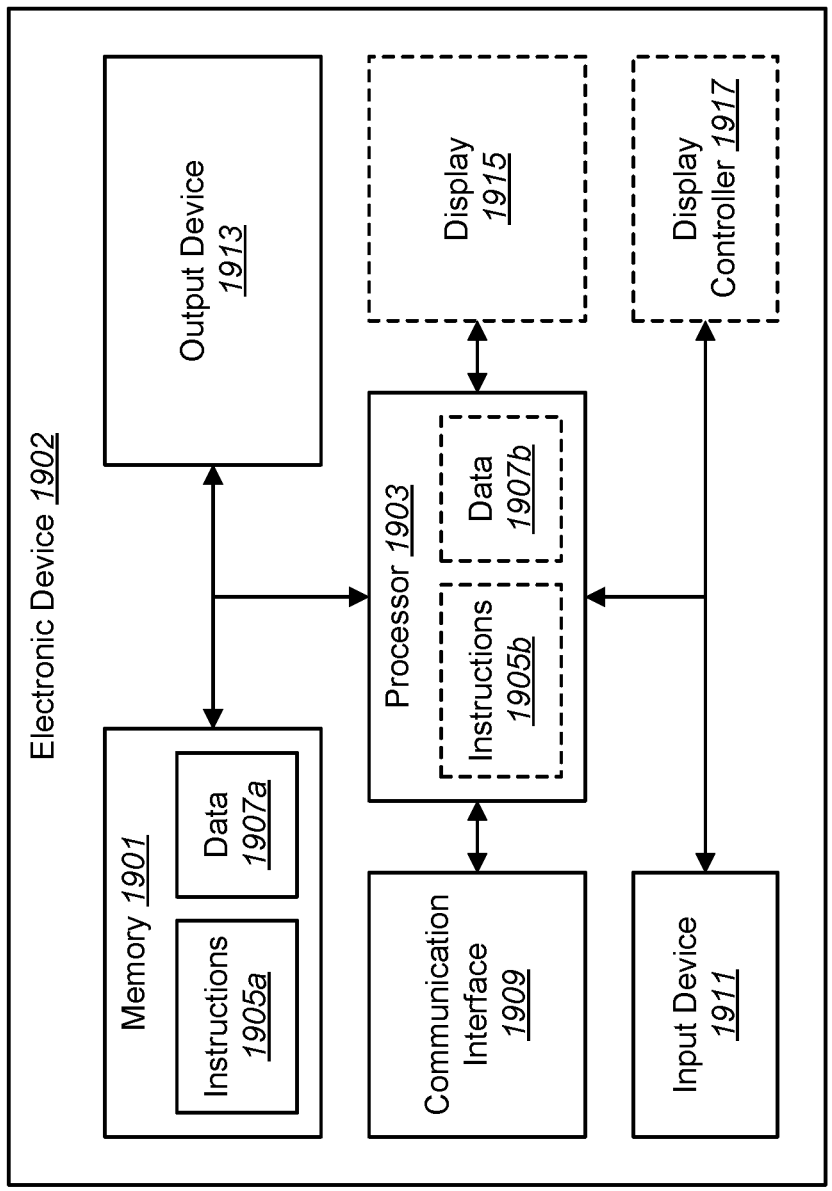
FIG. 19 illustrates various components that may be utilized in an electronic device.

FIG. 19 illustrates various components that may be utilized in an electronic device 1902. The electronic device 1902 described in connection with FIG. 19 may be configured in accordance with one or more of the electronic devices 102, 902 described herein. For example, the electronic device 1902 may be configured to perform one or more of the methods 200, 400, 700, 800 described above. The electronic device 1902 may include a memory 1901, a communication interface 1909, an input device 1911, a processor 1903, an output device 1913, a display 1915, and/or a display controller 1917. The memory 1901 may store instructions 1905a and data 1907a. The processor 1903 may operate on instructions 1905b and data 1907b. It should be noted that the display 1915 and/or display controller 1917 may be optional. For example, some configurations of the electronic device 1902 may not have a display. Additionally or alternatively, some configurations of the electronic device 1902 may include a button interface (e.g., an input device 1911). Some configurations of the electronic device 1902 may be controlled on a remote display device (e.g., a touch panel) with communication through a remote device (e.g., a controller, home automation controller, etc.).

The term "discrete circuit" refers to an electronic circuit built out of discrete components. Examples of discrete components include resistors, capacitors, inductors, transformers, transistors, etc. In some configurations, a discrete circuit may not be a solid state integrated circuit that performs all of the functions described herein. However, a discrete circuit may include one or more discrete components contained in the same packaging (e.g., bridge rectifier, solid state relay, etc.). In some configurations, a discrete circuit made from discrete components refers to a circuit having separate components or circuits that perform individual finite functions. For instance, examples of a discrete circuit may include load voltage measuring circuitry, switching circuitry, a processor, line voltage measuring circuitry, and/or current measuring circuitry that may perform separate and discrete functions while being implemented within an electronic device. An electronic device may be housed within a wall box. Moreover, each module within an electronic device may include discrete components or discrete circuits. In some instances, the term "circuit" may refer to a circuit in its entirety, for example, including the impedance of the wall box device and the impedance of the load.

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The term "computer-readable medium" refers to any available medium that can be accessed by a computer or processor. A computer-readable medium may be non-transitory and tangible. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the systems, methods, and apparatus described herein without departing from the scope of the claims.

What is claimed is:

1. An electronic device for detecting switching circuitry failure, comprising:
    load voltage measuring circuitry configured to measure a load voltage across a load terminal and a neutral terminal to produce a load voltage measurement; and
    a processor coupled to the load voltage measuring circuitry, wherein the processor is configured to detect switching circuitry failure based on measuring an upswing width and a downswing width of the load voltage measurement, and wherein the processor is configured to control the switching circuitry based on whether switching circuitry failure is detected.

2. The electronic device of claim 1, wherein, in a case that switching circuitry failure is detected, the processor is configured to control the switching circuitry by setting the switching circuitry to a fully activated state.

3. The electronic device of claim 2, wherein setting the switching circuitry to a fully activated state comprises setting a dimming level to no dimming.

4. The electronic device of claim 1, wherein the processor is configured to detect switching circuitry failure by detecting asymmetry in the load voltage measurement.

5. The electronic device of claim 4, wherein the processor is configured to detect the asymmetry in the load voltage measurement by detecting voltage of only one polarity in the load voltage measurement.

6. The electronic device of claim 4, wherein the processor is configured to detect the asymmetry in the load voltage measurement by detecting no zero cross within a time period.

7. The electronic device of claim 4, wherein the processor is configured to detect the asymmetry in the load voltage measurement by detecting a difference between a swing measure for an upswing and a swing measure for a downswing.

8. The electronic device of claim 1, wherein the processor is configured to detect switching circuitry failure by detecting asymmetry in the load voltage measurement with a threshold current draw.

9. The electronic device of claim 8, further comprising current measuring circuitry configured to produce a current measurement, wherein the processor is configured to detect the threshold current draw based on the current measurement.

10. The electronic device of claim 1, wherein the processor is configured to indicate a fault in a case that switching circuitry failure is detected.

11. A method for detecting switching circuitry failure by an electronic device, comprising:
    measuring a load voltage across a load terminal and a neutral terminal to produce a load voltage measurement;
    detecting switching circuitry failure based on measuring an upswing width and a downswing width of the load voltage measurement; and
    controlling the switching circuitry based on whether switching circuitry failure is detected.

12. The method of claim 11, wherein, in a case that switching circuitry failure is detected, controlling the switching circuitry comprises setting the switching circuitry to a fully activated state.

13. The method of claim 12, wherein setting the switching circuitry to a fully activated state comprises setting a dimming level to no dimming.

14. The method of claim 11, wherein detecting switching circuitry failure comprises detecting asymmetry in the load voltage measurement.

15. The method of claim 14, wherein detecting the asymmetry in the load voltage measurement comprises detecting voltage of only one polarity in the load voltage measurement.

16. The method of claim 14, wherein detecting the asymmetry in the load voltage measurement comprises detecting no zero cross within a time period.

17. The method of claim 14, wherein detecting the asymmetry in the load voltage measurement comprises detecting a difference between a swing measure for an upswing and a swing measure for a downswing.

18. The method of claim 11, wherein detecting switching circuitry failure comprises detecting asymmetry in the load voltage measurement with a threshold current draw.

19. The method of claim 18, further comprising:
    producing a current measurement; and
    detecting the threshold current draw based on the current measurement.

20. A non-transitory computer-readable medium for detecting switching circuitry failure, the computer-readable medium comprising executable instructions for:
    detecting switching circuitry failure based on measuring an upswing width and a downswing width of a load voltage measurement across a load terminal and a neutral terminal; and
    controlling the switching circuitry based on whether switching circuitry failure is detected.

* * * * *

UNITED STATES PATENT AND TRADEMARK OFFICE
CERTIFICATE OF CORRECTION

PATENT NO. : 10,845,425 B2
APPLICATION NO. : 15/419806
DATED : November 24, 2020
INVENTOR(S) : Robert Don Bruhn, Jr. et al.

It is certified that error appears in the above-identified patent and that said Letters Patent is hereby corrected as shown below:

In the Claims

In Column 27, Line 17, Claim 1, after "voltage across a load" please insert -- , wherein the load voltage is measured across a load --.

In Column 27, Line 18, Claim 1, after "a load voltage measurement;" please insert
-- switching circuitry coupled to the load and configured to activate or deactivate the load; --.

In Column 28, Line 9, Claim 11, after "voltage across a load" please insert -- , wherein the load voltage is measured across a load --.

In Column 28, Line 11, Claim 11, after "ment" please insert -- , and wherein switching circuitry is coupled to the load and configured to activate or deactivate the load --.

In Column 28, Line 50, Claim 20, after "measurement across a load" please insert -- , wherein the load voltage measurement is across a load --.

In Column 28, Line 51, Claim 20, after "neutral terminal" please insert -- , and wherein switching circuitry is coupled to the load and configured to activate or deactivate the load --.

Signed and Sealed this
Twenty-fifth Day of May, 2021

Drew Hirshfeld
*Performing the Functions and Duties of the
Under Secretary of Commerce for Intellectual Property and
Director of the United States Patent and Trademark Office*